(12) United States Patent
Fukuoka et al.

(10) Patent No.: US 11,049,895 B2
(45) Date of Patent: Jun. 29, 2021

(54) SOLID-STATE IMAGING ELEMENT, ELECTRONIC DEVICE, AND FABRICATION METHOD

(71) Applicant: SONY SEMICONDUCTOR SOLUTIONS CORPORATION, Kanagawa (JP)

(72) Inventors: Shinpei Fukuoka, Nagasaki (JP); Hideaki Togashi, Nagasaki (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/494,845

(22) PCT Filed: Mar. 16, 2018

(86) PCT No.: PCT/JP2018/010393
§ 371 (c)(1),
(2) Date: Sep. 17, 2019

(87) PCT Pub. No.: WO2018/180575
PCT Pub. Date: Oct. 4, 2018

(65) Prior Publication Data
US 2020/0286941 A1 Sep. 10, 2020

(30) Foreign Application Priority Data
Mar. 31, 2017 (JP) .............................. JP2017-069803

(51) Int. Cl.
*H01L 27/146* (2006.01)
*H04N 5/374* (2011.01)

(52) U.S. Cl.
CPC .. *H01L 27/14636* (2013.01); *H01L 27/14603* (2013.01); *H01L 27/14612* (2013.01);
(Continued)

(58) Field of Classification Search
CPC ......... H01L 27/14636; H01L 27/14603; H01L 27/14612; H01L 27/14623;
(Continued)

(56) References Cited

U.S. PATENT DOCUMENTS

2011/0156104 A1* 6/2011 Yamaguchi ....... H01L 27/14603
257/222
2012/0292784 A1* 11/2012 Nishio .................... H01L 23/26
257/774
(Continued)

FOREIGN PATENT DOCUMENTS

JP 2015-038931 2/2015
JP 2016-225330 12/2016
(Continued)

OTHER PUBLICATIONS

International Search Report prepared by the Japan Patent Office dated Apr. 24, 2018, for International Application No. PCT/JP2018/010393.

*Primary Examiner* — Timothy J Henn
(74) *Attorney, Agent, or Firm* — Sheridan Ross P.C.

(57) ABSTRACT

This disclosure relates to a solid-state imaging element, an electronic device, and a fabrication method that each enable further reduction of the element layout area. A photoelectric conversion element disposed on a first face of a semiconductor substrate is connected to a gate of an amplification transistor and a floating diffusion disposed in a second face of the semiconductor substrate through penetrating electrodes that are each connected to the photoelectric conversion element. In this pixel structure, a dielectric layer is disposed between the penetrating electrodes in the second face, and a shielded electrode is disposed on an inner side of the dielectric layer seen from a side of the second face. The dielectric layer is thicker than a gate insulating film of the
(Continued)

transistor on the side of the second face. This disclosure is applicable to a back-side illumination solid-state imaging element, for example.

17 Claims, 24 Drawing Sheets

(52) U.S. Cl.
CPC .. *H01L 27/14623* (2013.01); *H01L 27/14645* (2013.01); *H04N 5/374* (2013.01)

(58) Field of Classification Search
CPC ......... H01L 27/14645; H01L 27/14683; H01L 27/14609; H01L 27/14601; H01L 21/76898; H01L 27/146; H04N 5/374; H04N 5/369
See application file for complete search history.

(56) References Cited

U.S. PATENT DOCUMENTS

| | | | |
|---|---|---|---|
| 2014/0117486 A1 | 5/2014 | Doi et al. | |
| 2015/0001376 A1* | 1/2015 | Miyanami | H01L 27/14614 250/208.1 |
| 2015/0372036 A1* | 12/2015 | Suh | H01L 27/14609 348/273 |
| 2016/0204156 A1* | 7/2016 | Togashi | H04N 5/3745 257/292 |
| 2017/0148838 A1* | 5/2017 | Togashi | H04N 5/361 |
| 2017/0243912 A1* | 8/2017 | Kaneda | H01L 27/14621 |
| 2018/0286922 A1* | 10/2018 | Togashi | H01L 21/76898 |

FOREIGN PATENT DOCUMENTS

| | | | | |
|---|---|---|---|---|
| WO | WO 2013/001809 | 1/2013 | | |
| WO | WO-2015025723 A1 * | 2/2015 | ............ | H04N 5/379 |
| WO | WO 2016/143531 | 9/2016 | | |

* cited by examiner

SOLID-STATE IMAGING ELEMENT, ELECTRONIC DEVICE, AND FABRICATION METHOD

CROSS REFERENCE TO RELATED APPLICATIONS

This application is a national stage application under 35 U.S.C. 371 and claims the benefit of PCT Application No. PCT/JP2018/010393 having an international filing date of 16 Mar. 2018, which designated the United States, which PCT application claimed the benefit of Japanese Patent Application No. 2017-069803 filed 31 Mar. 2017, the entire disclosures of each of which are incorporated herein by reference.

TECHNICAL FIELD

This disclosure relates to a solid-state imaging element, an electronic device, and a fabrication method and, more particularly, to a solid-state imaging element, an electronic device, and a fabrication method that each enable further reduction of an element layout area.

BACKGROUND ART

In an imaging apparatus such as a digital camera, an image sensor having photoelectric conversion films stacked on each other therein takes a penetrating electrode structure that connects the photoelectric conversion films and a floating diffusion to each other as disclosed in, for example, PTL 1. The image sensor may take a structure having the penetrating electrodes arranged therein to be close to each other when the pixel size is minute and, in this case, a shielded electrode is arranged to prevent any electric color mixture caused by capacitance coupling.

CITATION LIST

Patent Literature

[PTL 1]
Japanese Patent Laid-Open No. 2015-38931

SUMMARY

Technical Problem

In PTL 1, it is worried that the shielded electrode and wiring connected to the floating diffusion short-circuit with each other due to the process dispersion as to the superimposition and the line width, and a countermeasure is therefore taken to set the penetrating electrode and the shielded electrode to be away from each other. As a result, the pixel size becomes large, the photodiode area is reduced, the saturation signal amount and the sensitivity property are degraded, and the like.

This disclosure has been conceived in view of the above circumstances and can further reduce the element layout area.

Solution to Problem

A solid-state imaging element in an aspect of this technique includes: a photoelectric conversion element that is disposed on a side of a first face of a semiconductor substrate; penetrating electrodes that are each connected to the photoelectric conversion element, the penetrating electrodes each being disposed between the first face of the semiconductor substrate and a second face thereof that is a face different from the first face; a transistor and a floating diffusion that are disposed in the second face, the transistor and the floating diffusion being connected to the photoelectric conversion element through the penetrating electrodes; and a dielectric layer that is formed between the penetrating electrodes in the second face, the dielectric layer being thicker than a gate insulating film of the transistor.

The solid-state imaging element can further include a shielded electrode on an inner side of the dielectric layer seen from a side of the second face.

A material of the shielded electrode includes polysilicon or amorphous silicon.

The shielded electrode is controlled to be at a predetermined voltage from a contact electrically connected to the shielded electrode and wiring electrically connected to the contact.

The contact electrically connected to the shielded electrode is disposed between the penetrating electrodes.

The contact electrically connected to the shielded electrode is disposed in a line between the penetrating electrodes.

The dielectric layer is disposed on a circumference of the penetrating electrodes.

The penetrating electrodes each penetrate the semiconductor substrate and are each isolated from the semiconductor substrate by an isolation trench, and the dielectric layer and the isolation trench are in contact with each other.

The solid-state imaging element can further include one or a plurality of photodiodes disposed in the semiconductor substrate.

An electronic device in an aspect of this technique includes: a solid-state imaging element that includes a photoelectric conversion element disposed on a side of a first face of a semiconductor substrate, penetrating electrodes that are each connected to the photoelectric conversion element, the penetrating electrodes each being disposed between the first face of the semiconductor substrate and a second face thereof that is a face different from the first face, a transistor and a floating diffusion that are disposed in the second face, the transistor and the floating diffusion being connected to the photoelectric conversion element through the penetrating electrodes, and a dielectric layer that is formed between the penetrating electrodes in the second face, the dielectric layer being thicker than a gate insulating film of the transistor; a signal processing circuit that processes an output signal output from the solid-state imaging element; and an optical system that emits incident light into the solid-state imaging element.

A fabrication method, by a fabricating apparatus, of this technique includes: forming through-holes between a first face of a semiconductor substrate and a second face thereof that is a face different from the first face; forming a dielectric layer between the through-holes in the second face, the dielectric layer being thicker than a gate insulating film of a transistor formed in the second face; forming, in the second face, gate wiring that includes the transistor; forming penetrating electrodes each by burying a metal material film in each of the through-holes; and forming, in the first face, the photoelectric conversion element that is connected to the transistor and a floating diffusion through the penetrating electrodes.

In an aspect of this technique, a photoelectric conversion element is disposed on the side of a first face of a semiconductor substrate, penetrating electrodes are each connected to the photoelectric conversion element and are disposed between the first face of the semiconductor substrate and a second face thereof that is a face different from the first face, and a transistor and a floating diffusion are disposed in the second face and are connected to the photoelectric conversion element through the penetrating electrodes. A dielectric layer thicker than a gate insulating film of the transistor is further formed between the penetrating electrodes in the second face.

Advantageous Effect of Invention

According to this technique, the element layout area can further be reduced.

The effect described herein is absolutely exemplification and effects of this technique are not limited to the effect described herein and any additional effects may be achieved.

DESCRIPTION OF EMBODIMENTS

Modes each to implement this disclosure (hereinafter, each referred to as embodiments) will be described below. The description will be made in the following order.

0. Description of Apparatus
1. Embodiments
2. Use Examples of Image Sensor
3. Example of Electronic Device
4. Application Example for In-vivo Information Acquisition System
5. Application Example for Endoscopic Surgery System.
6. Application Example for Mobile Body
7. Exemplary Configuration of Laminated Solid-State Imaging Element 0. Description of Apparatus <Exemplary Schematic Configuration of Solid-State Imaging Element>

Figure 1:
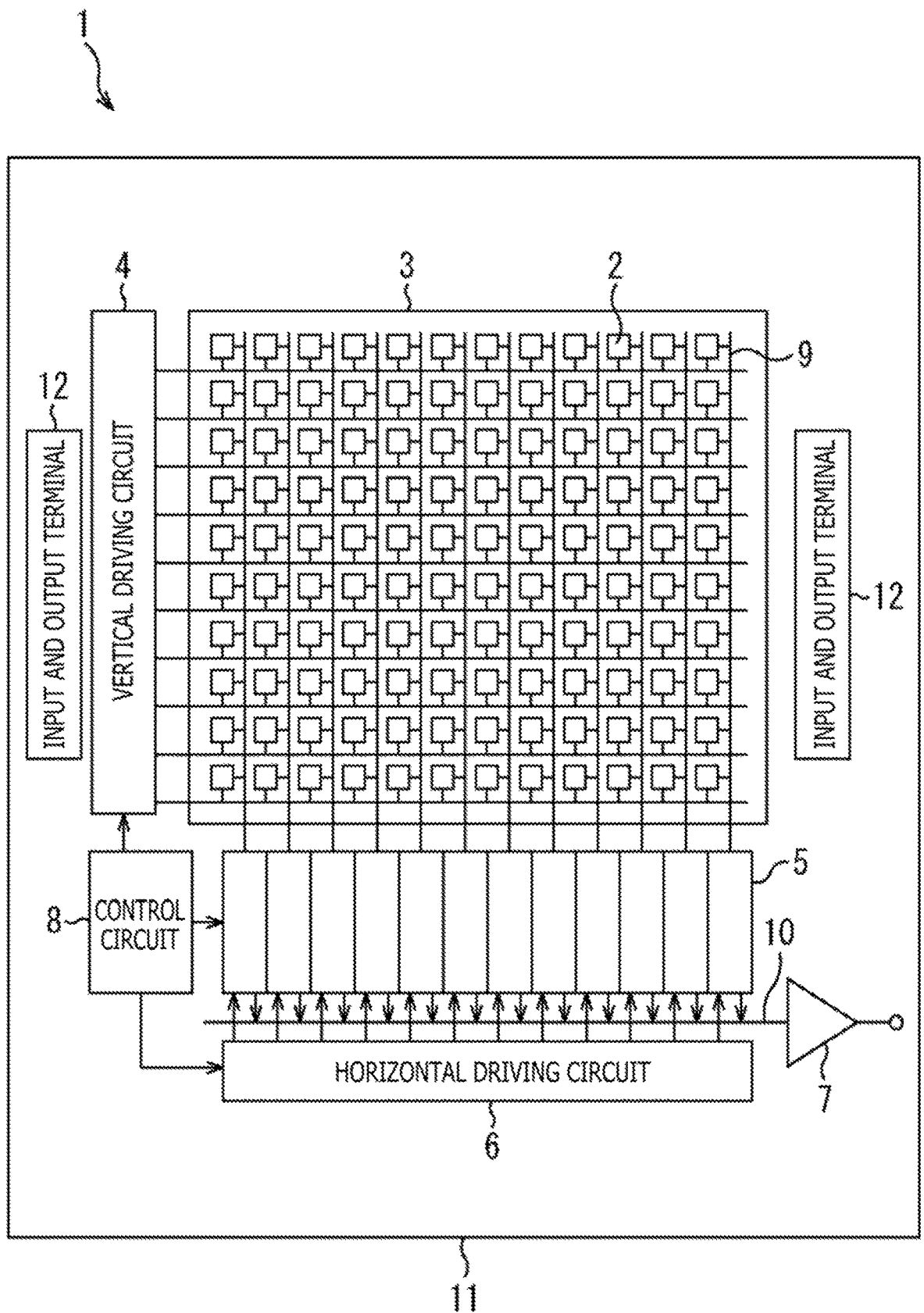
FIG. 1 is a block diagram depicting an exemplary schematic configuration of a solid-state imaging element to which this technique is applied.

FIG. 1 depicts an exemplary schematic configuration of an example of a CMOS (Complementary Metal Oxide Semiconductor) solid-state imaging element applied to embodiments of this technique.

As depicted in FIG. 1, the solid-state imaging element (an element chip) 1 includes a pixel region (a what-is-called imaging region) 3 that has pixels 2 each including plural photoelectric conversion elements, regularly and two-dimensionally arranged therein on a semiconductor substrate 11 (silicon substrate, for example), and a peripheral circuit region.

The pixel 2 includes the photoelectric conversion elements (for example, PDs (Photo Diodes)) and plural pixel transistors (the what-is-called MOS transistors). The plural pixel transistors can include three transistors that are, for example, a transfer transistor, a reset transistor, and an amplification transistor, or can include four transistors by further adding a selection transistor.

Moreover, the pixel 2 can also take a pixel sharing structure. The pixel sharing structure includes plural photodiodes, plural transfer transistors, one floating diffusion to be shared, and each one of other pixel transistors to be shared. The photodiode is a photoelectric conversion element.

The peripheral circuit region includes a vertical driving circuit 4, column signal processing circuits 5, a horizontal driving circuit 6, an output circuit 7, and a control circuit 8.

The control circuit 8 receives an input clock, data ordering an operation mode and the like, and also outputs data such as the internal information of the solid-state imaging element 1. More specifically, the control circuit 8 generates a clock signal and control signals to be the criteria for the operations of the vertical driving circuit 4, the column signal processing circuits 5, and the horizontal driving circuit 6 on the basis of a vertical synchronization signal, a horizontal synchronization signal, and a master clock. The control circuit 8 also inputs these signals into the vertical driving circuit 4, the column signal processing circuits 5, and the horizontal driving circuit 6.

The vertical driving circuit 4 includes, for example, a shift register, selects pixel driving wiring, supplies a pulse to drive the pixels 2 to the selected pixel driving wiring, and drives the pixels 2 in a row as a unit. More specifically, the vertical driving circuit 4 selectively scans the pixels 2 in the pixel region 3 in a row as a unit sequentially in the vertical direction, and supplies a pixel signal on the basis of a signal charge generated corresponding to the received light amount by the photoelectric conversion element of each of the pixels 2 to the column signal processing circuit 5 through a vertical signal line 9.

The column signal processing circuits 5 are each arranged for, for example, each one of columns of the pixels 2, and each execute signal processing such as denoising and the like for each of the pixel columns, for the signal output from the pixels 2 in each of the rows. More specifically, the column signal processing circuit 5 executes signal processing such as CDS (Correlated Double Sampling) to remove fixed pattern noises specific to the pixels 2, signal amplification, A/D (Analog/Digital) conversion, and the like. The output stage of the column signal processing circuit 5 has a horizontal selection switch (not depicted) disposed therein being connected between the column signal processing circuit 5 and the horizontal signal line 10. Concerning this, a portion of the signal processing may be executed as signal processing for each of the pixels.

The horizontal driving circuit 6 includes, for example, a shift register, sequentially outputs horizontal scanning pulses, thereby sequentially selects each of the column signal processing circuits 5, and causes the pixel signals to be output from each of the column signal processing circuit 5 to the horizontal signal line 10.

The output circuit 7 executes signal processing for the signals sequentially supplied thereto from each of the column signal processing circuits 5 through the horizontal signal line 10 and outputs the processed signals. The output circuit 7 executes, for example, only buffering in some cases and executes black level adjustment, column dispersion correction, various types of digital signal processing, and the like in other cases.

The input and output terminal 12 is disposed to transmit and receive signals with the exterior.

1. Embodiments

Figure 2:
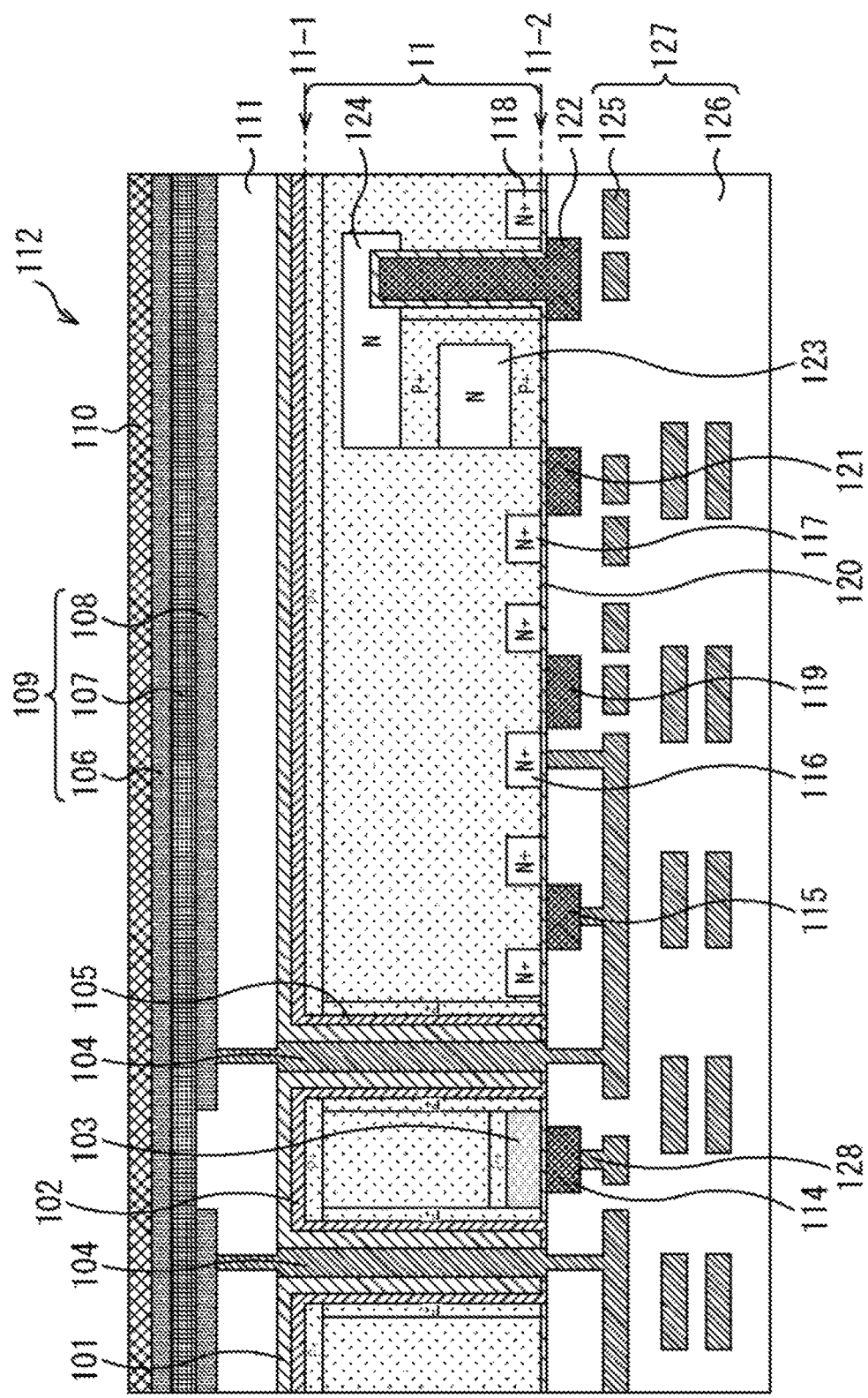
FIG. 2 is a cross-sectional diagram depicting an exemplary structure of a pixel of a first embodiment of the solid-state imaging element to which this technique is applied.

Exemplary Pixel Structure of First Embodiment of Solid-State Imaging Element FIG. 2 is a cross-sectional diagram depicting an exemplary structure of the pixel of a first embodiment of the solid-state imaging element to which this technique is applied.

The structure of the pixel depicted in FIG. 2 includes a photoelectric conversion element 109 disposed on a first face 11-1 of the semiconductor substrate 11, the penetrating electrodes 104 each connected to the photoelectric conversion element 109 and each disposed between the first face and a second face of the semiconductor substrate 11, an amplification transistor 115 and a floating diffusion 116 that are disposed on the second face 11-2 of the semiconductor substrate 11. The photoelectric conversion element 109 is connected to the gate of the amplification transistor 115 and the floating diffusion 116 through the penetrating electrodes 104.

Moreover, in this structure of the pixel, a dielectric layer 103 is disposed between the penetrating electrodes 104 in the second face 11-2 and a shielded electrode 114 is disposed on the inner side of the dielectric layer 103 seen from the side of the second face 11-2. The dielectric layer 103 is formed to be thicker than a gate insulating film 120 of the transistor (for example, the amplification transistor 115) arranged on the side of the second face 11-2. The shielded electrode 114 is controlled to be at a predetermined voltage, from a contact 128 electrically connected to the shielded electrode 114 and wiring electrically connected to the contact 128.

According to the structure of the pixel in FIG. 2, when the penetrating electrodes from the first face 11-1 of the semiconductor substrate 11 are formed, the dielectric layer 103 tends to avoid being processed and the diameter of the penetrating electrode 104 is defined in a self-alignment manner by the dielectric layer 103 due to the characteristic that the etching rate of the dielectric layer 103 is lower than that of the semiconductor substrate 11. Arranging the shielded electrode 114 on the dielectric layer 103 causes the penetrating electrodes 104 and the shielded electrode 114 to tend to avoid short-circuiting therebetween. As a result, further reduction of the element layout area is enabled and effects are expected that the pixel size can be set to further be minute and that the saturation signal amount and the sensitivity property can be improved.

Moreover, in the solid-state imaging element 1, as depicted in FIG. 2, it is preferred that an isolation trench 105 isolating the penetrating electrode 104 and the semiconductor substrate 11 from each other be formed to take a structure for the isolation trench 105 to be filled with a dielectric 101. It is preferred that an impurity region (that is P+ in FIG. 2) be disposed in the semiconductor substrate on the outer side face of the isolation trench 105 and the outer side face of the dielectric layer 103.

Furthermore, disposing the dielectric layer 103 beneath the shielded electrode 114 achieves an effect that a hole accumulation layer can be formed on the outer side face of the dielectric layer 103 of the semiconductor substrate 11 even under the condition that a positive bias is applied to the shielded electrode 114. To form the hole accumulation layer, for example, it is preferred that the thickness of the dielectric layer 103 be 20 nm or larger.

Moreover, the shielded electrode 114 is desirably disposed on the inner side of the dielectric layer 103 seen from the side of the second face 11-2 and the shielded electrode 114 is desirably arranged at the position distant from an end of the dielectric layer 103 inward by, for example, 20 nm or larger.

Furthermore, it is preferred that the dielectric layer 103 be arranged between the penetrating electrodes 104 for the distance between the isolation trench 105 and the dielectric layer 103 to be a distance smaller than 30% of the diameter of the penetrating electrode 104 and the isolation trench 105. For example, it is preferred that, when the diameter of the penetrating electrode 104 and the isolation trench 105 is 350 nm, the distance between the isolation trench 105 and the dielectric layer 103 be 100 nm or smaller.

The material of the dielectric layer 103 is not especially limited while the usable materials includes, for example, a silicon dioxide film, a silicon nitride film, and a silicon oxynitride film.

The shielded electrode 114 includes a doped silicon material such as, for example, polysilicon, PDAS (Phosphorus Doped Amorphous Silicon), or the like. The material constituting the penetrating electrode 104 is not especially limited while it is preferred that the material be a metal such as aluminum, tungsten, titanium, cobalt, hafnium, or tantalum, or a dielectric material.

Concerning the above, though not depicted in FIG. 2, an on-chip lens and a color filter may be formed when necessary on a light incident face 112.

Figure 3:
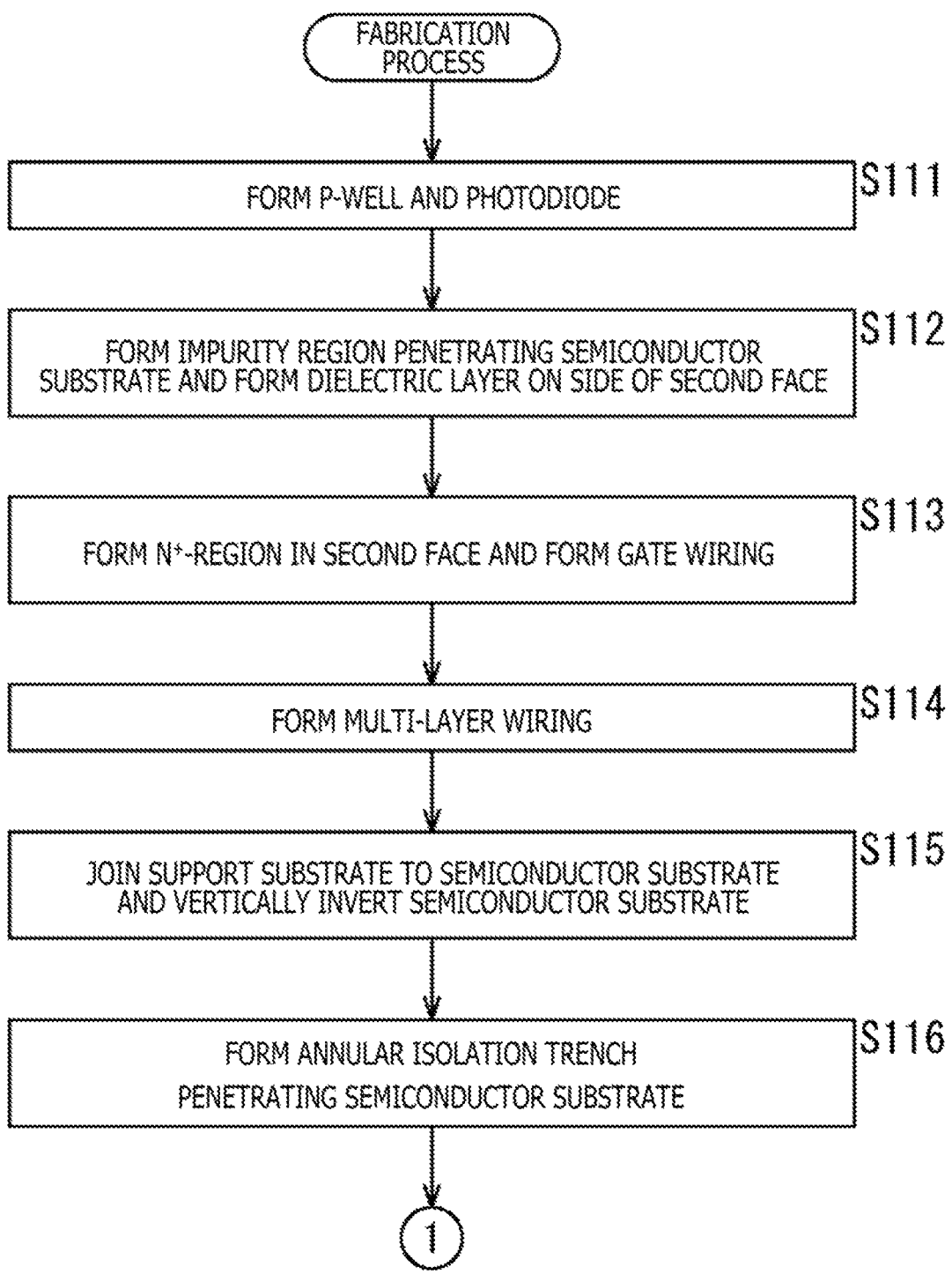
FIG. 3 is a flowchart explaining a fabrication process for the solid-state imaging element.

A fabrication process for the solid-state imaging element 1 having the structure in FIG. 2 will next be described with reference to flowcharts in FIG. 3 and FIG. 4. Concerning this, the fabrication process is a process executed by a fabricating apparatus and step diagrams of FIG. 5 to FIG. 10 will properly be referred to.

Figure 5:
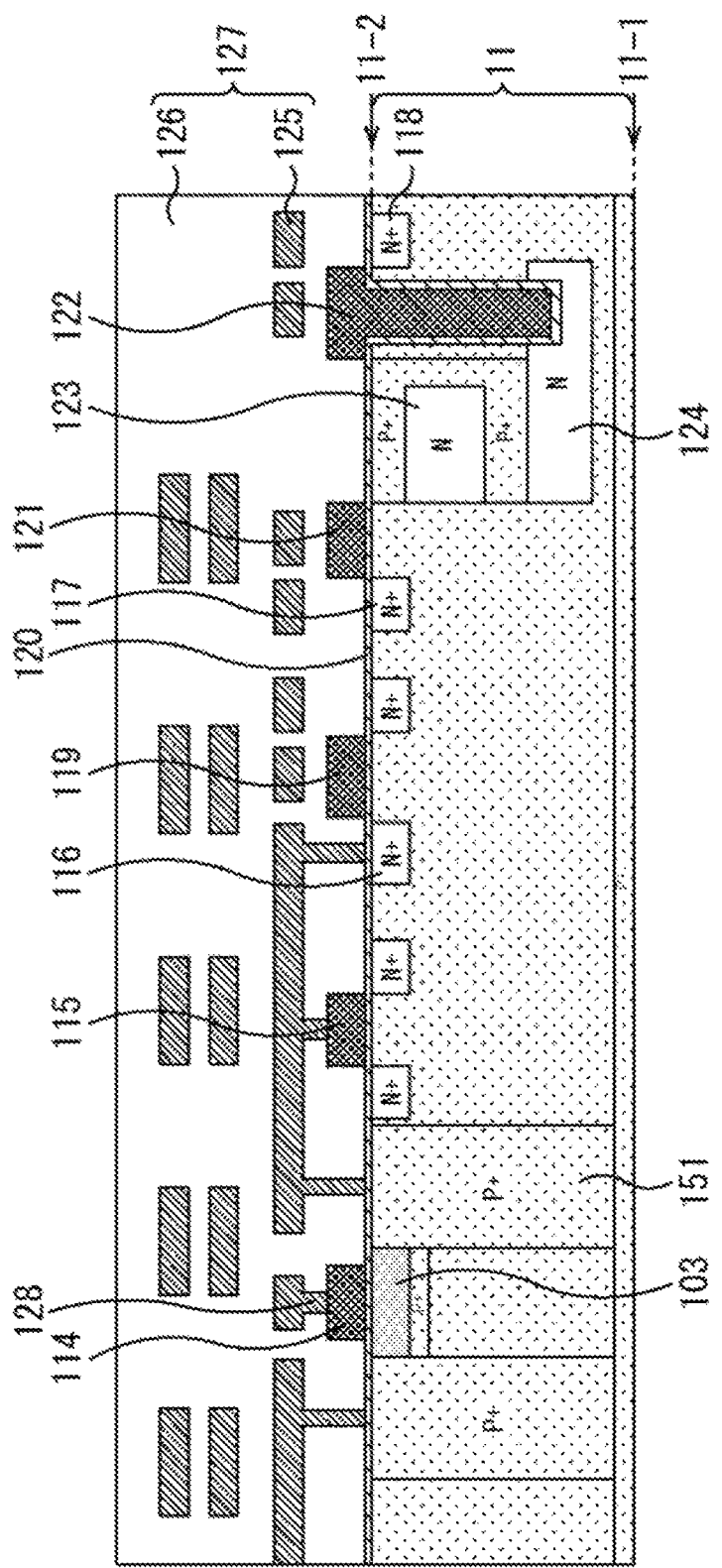
FIG. 5 is a step diagram explaining the fabrication process for the solid-state imaging element.

At step S111, as depicted in FIG. 5, the fabricating apparatus first forms, for example, a P-well as a well of a first conductivity type in the semiconductor substrate 11, and forms photodiodes 123 and 124 of a second conductivity type (for example, an N-type) in the P-well. At this time, a P+-region is formed in the vicinity of the first face 11-1 of the semiconductor substrate 11.

At step S112, as depicted in FIG. 5, the fabricating apparatus forms an impurity region (a P+-region) that penetrates from the first face 11-1 to the second face 11-2 of the semiconductor substrate 11, in a formation scheduled regions 151 each for the penetrating electrode 104 and the isolation trench 105. Moreover, the fabricating apparatus forms the dielectric layer 103 on the side of the second face 11-2 between the formation scheduled regions 151. In addition, the dielectric layer 103 may be formed at the same time with the formation of an element isolation such as, for example, STI to be arranged on the side of the second face 11-2.

At step S113, in the second face 11-2 of the semiconductor substrate 11, as also depicted in FIG. 5, the fabricating apparatus forms an N+-region to act as floating diffusions (hereinafter, each referred to as FDs) 116 to 118 and thereafter forms gate wiring that includes a gate insulating film 120, a vertical transfer gate 122, a transfer gate 121, and gates of an amplification transistor 115 and a reset transistor 129.

Furthermore, at step S114, the fabricating apparatus forms a multi-layer wiring 127 that includes a contact 128, a wiring layer 125, and an insulating film 126, on the second face 11-2 of the semiconductor substrate 11.

For example, an SOI (Silicon On Insulator) substrate formed by stacking the semiconductor substrate 11, an embedded oxide film (not depicted), and a support substrate (not depicted) on each other is used as the base body of the semiconductor substrate 11. The embedded oxide film and the support substrate are not depicted in FIG. 5 but are joined to the first face 11-1 of the semiconductor substrate 11. After ion implantation, an annealing treatment is executed.

Figure 6:
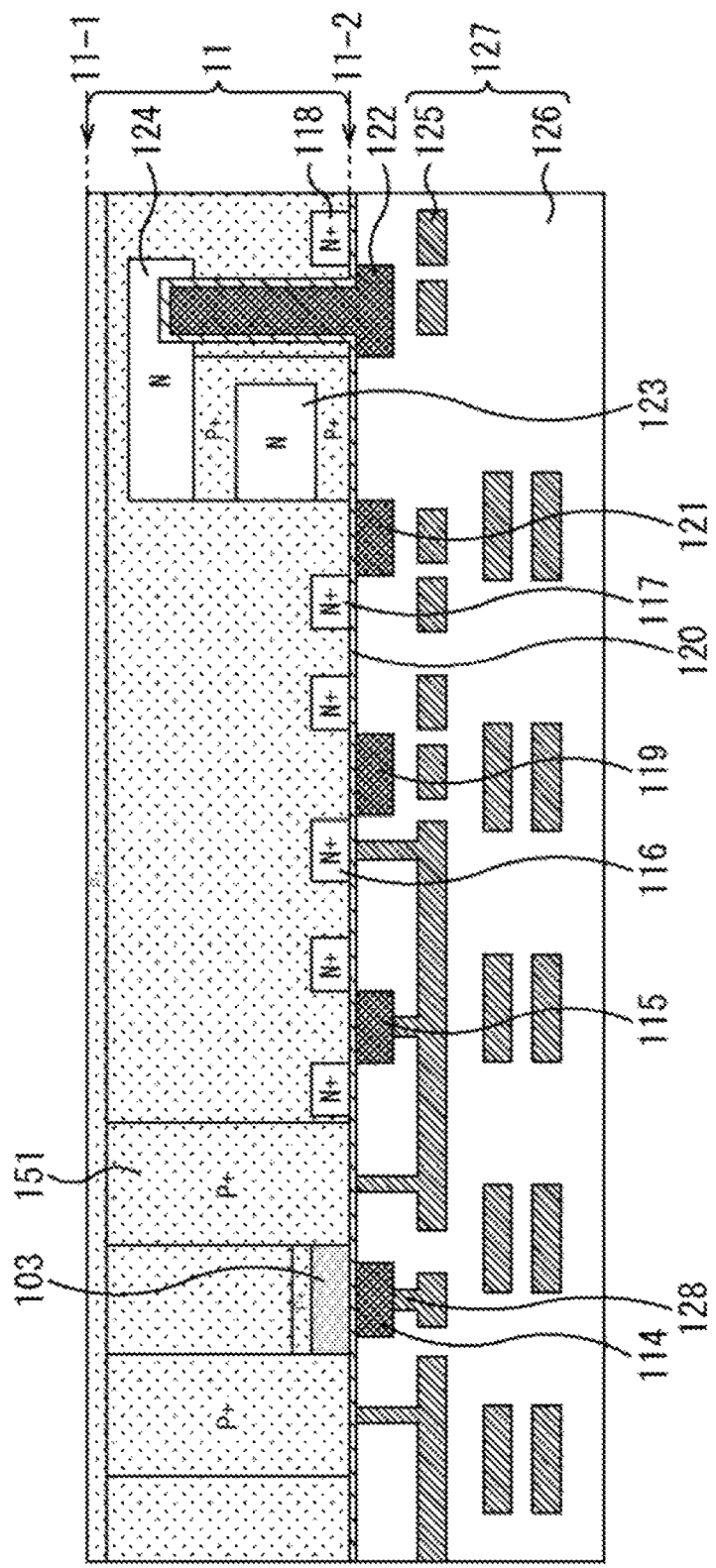
FIG. 6 is a step diagram explaining the fabrication process for the solid-state imaging element.

At step S115, as depicted in FIG. 6, the fabricating apparatus joins the support substrate (not depicted), another semiconductor substrate, or the like to the side of the second face 11-2 of the semiconductor substrate 11 (the multi-layer wiring) and vertically inverts the solid-state imaging element 1. The semiconductor substrate 11 is thereafter separated from the embedded oxide film and the support substrate of the SOI substrate to expose the first face 11-1 of the semiconductor substrate 11.

The above steps can be executed using the techniques used in an ordinary CMOS process such as ion implantation and CVD (Chemical Vapor Deposition).

Figure 7:
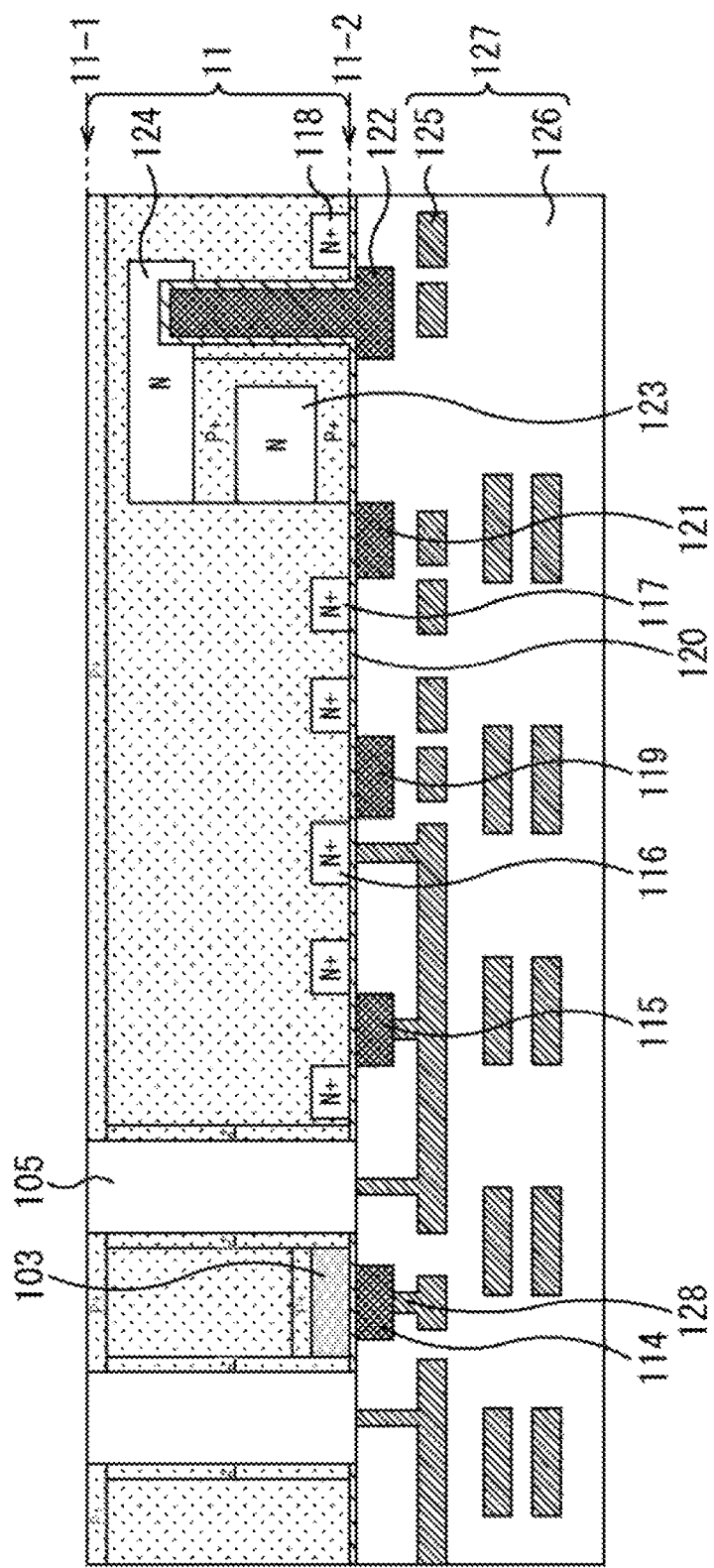
FIG. 7 is a step diagram explaining the fabrication process for the solid-state imaging element.

At step S116, as depicted in FIG. 7, the fabricating apparatus thereafter processes the semiconductor substrate 11 from the side of the first face 11-1 by, for example, dry etching to thereby form the isolation trench 105 having an annular shape or a ring shape, and penetrating the semiconductor substrate 11.

Figure 8:
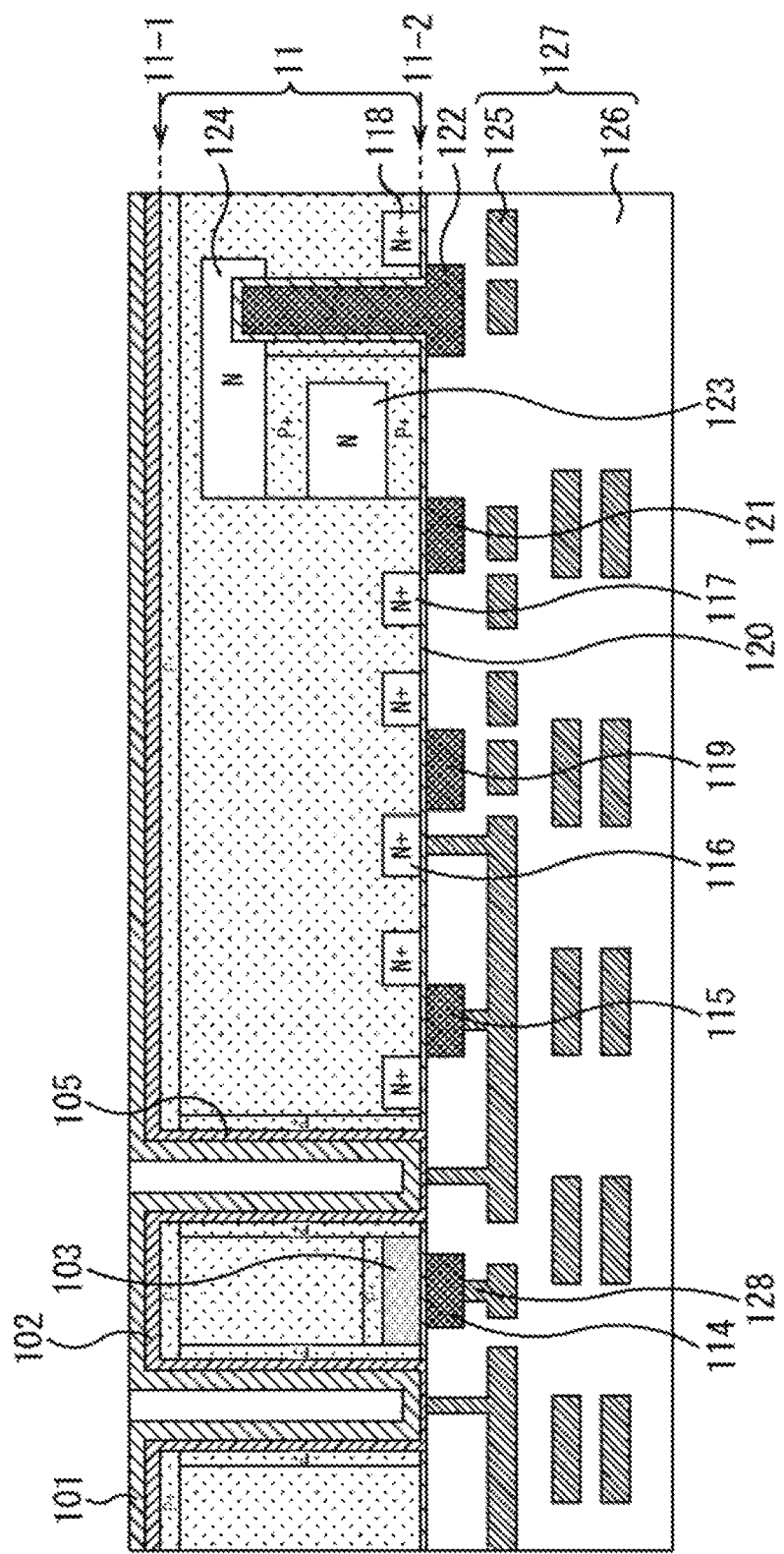
FIG. 8 is a step diagram explaining the fabrication process for the solid-state imaging element.

At step S117, as depicted in FIG. 8, the fabricating apparatus forms a film 102 having a fixed charge and a film of the dielectric 101 on the outer side face and the bottom face of the isolation trench 105 and the first face 11-1 of the semiconductor substrate 11. A silicon dioxide film, a silicon nitride film, or the like formed by a TEOS or an ALD method is usable as the material of the dielectric 101.

Figure 4:
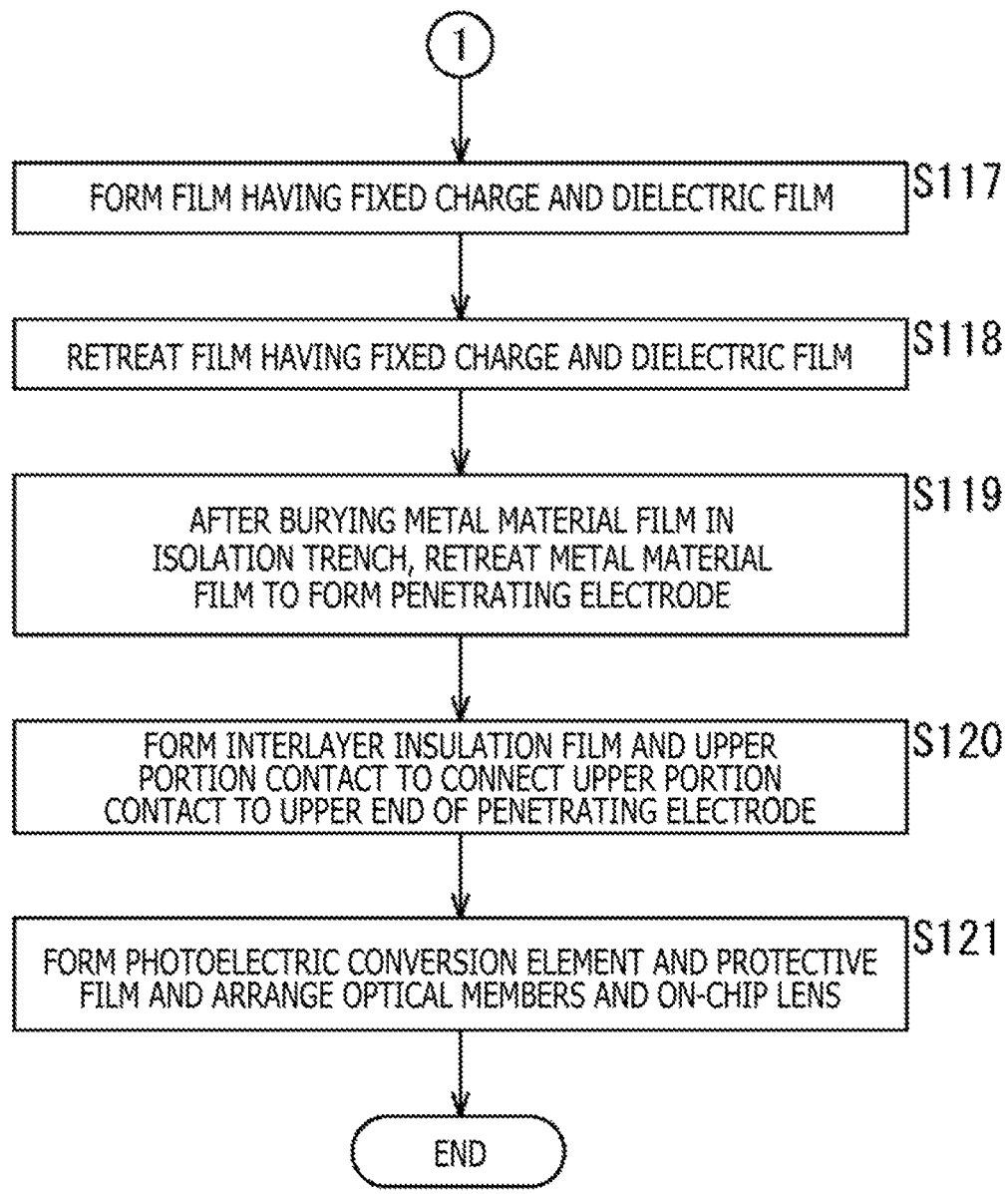
FIG. 4 is a flowchart explaining the fabrication process for the solid-state imaging element.
Figure 9:
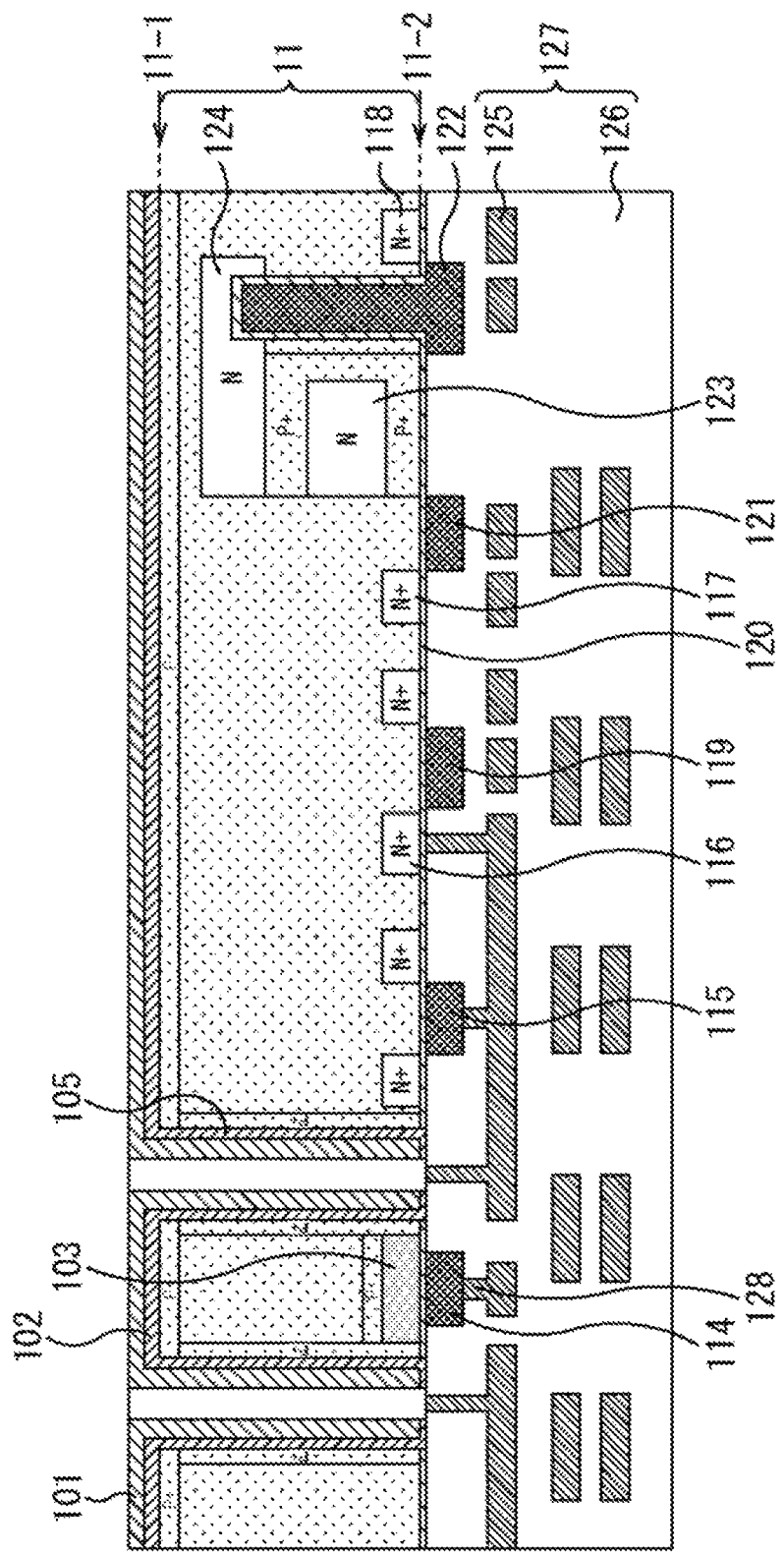
FIG. 9 is a step diagram explaining the fabrication process for the solid-state imaging element.

At step S118 in FIG. 4, as depicted in FIG. 9, the fabricating apparatus next retreats the film 102 having the fixed charge and the dielectric 101 by dry etching or the like.

Figure 10:
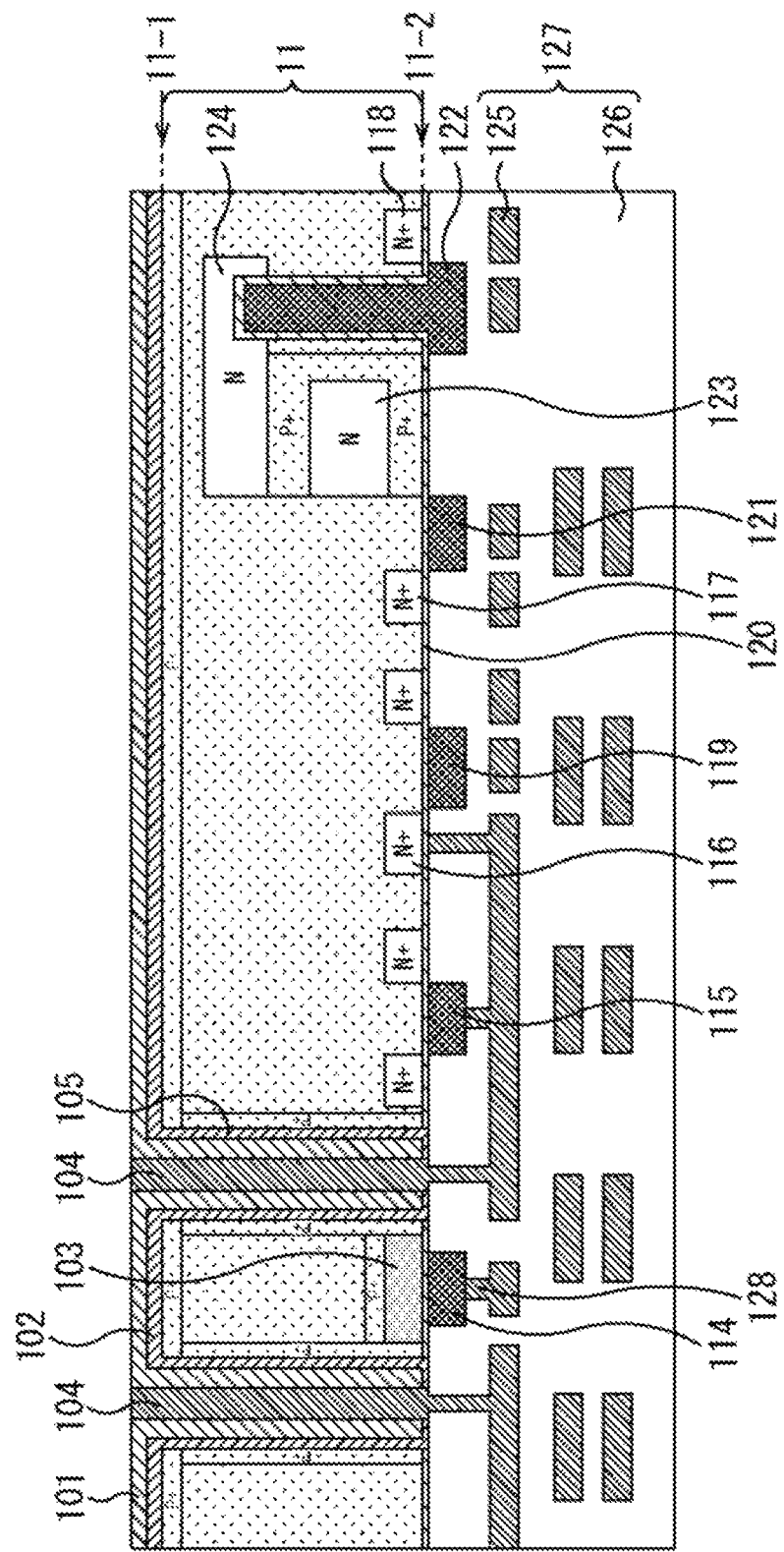
FIG. 10 is a step diagram explaining the fabrication process for the solid-state imaging element.

At step S119, as depicted in FIG. 10, after burying the metal material film in the isolation trench 105, the fabricating apparatus retreats or flattens the metal material film by dry etching or CMP (Chemical Mechanical Polishing) to thereby form the penetrating electrode 104.

At step S120, as depicted in FIG. 2, the fabricating apparatus further forms the interlayer insulating film 111 and an upper portion contact to thereby connect the upper portion contact to the upper end of the penetrating electrode 104. At step S121, the fabricating apparatus thereafter forms the photoelectric conversion element 109 including a transparent electrode 106, a photoelectric conversion film 107, and a transparent electrode 108, and a protective film 110, and finally disposes optical members such as a flattened film, and an on-chip lens (not depicted).

The solid-state imaging element 1 having the structure in FIG. 2 is completed by the above process steps.

Figure 11:
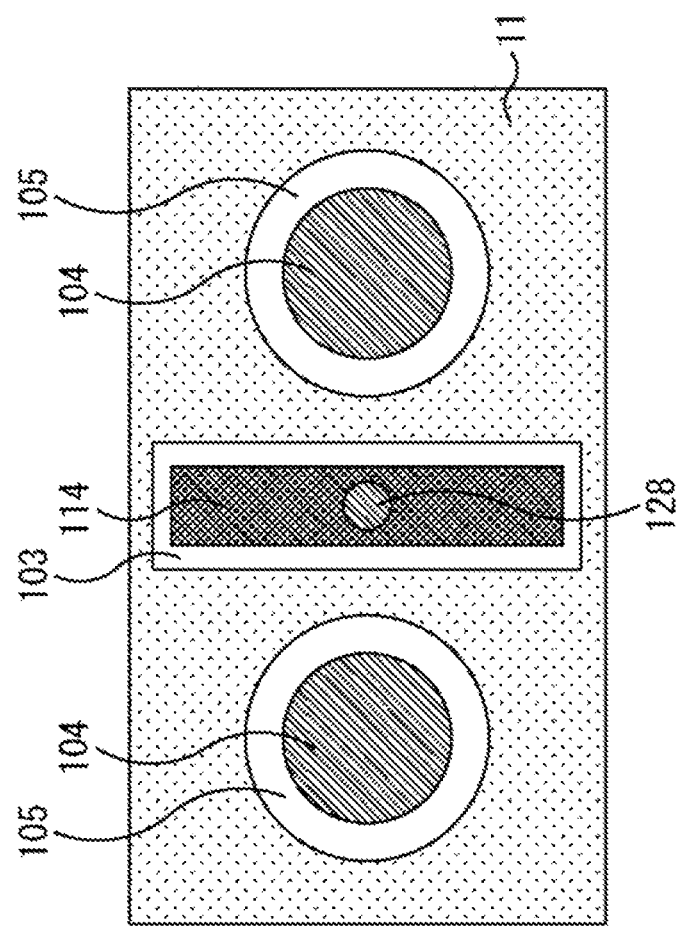
FIG. 11 is a top diagram depicting an exemplary structure of a pixel of a second embodiment of the solid-state imaging element to which this technique is applied.

Exemplary Structure of Pixel of Second Embodiment of Solid-State Imaging Element FIG. 11 is a top diagram depicting an exemplary structure of a pixel of a second embodiment of the solid-state imaging element to which this technique is applied.

In the structure of the pixel in FIG. 11, only the point that a contact 128 is disposed between the penetrating electrodes 104 differs from the structure of the pixel in FIG. 2, and the other portion of the structure is basically common to the structure of the pixel in FIG. 2. In other words, the structure of the pixel depicted in FIG. 11 is characterized in that the contact 128 electrically connected to the shielded electrode 114 is disposed between the penetrating electrodes 104.

Any capacitance coupling between the penetrating electrodes 104 can thereby be further prevented with the structure of the pixel in FIG. 11 compared to that of the structure of the pixel in FIG. 2.

The material of the contact 128 is not especially limited while the usable materials include metal materials such as aluminum, tungsten, titanium, cobalt, hafnium, or tantalum, Furthermore, the corner portions of the dielectric layer 103 and the shielded electrode 114 may be round.

Exemplary Structure of Pixel of Third Embodiment of Solid-State Imaging Element

Figure 12:
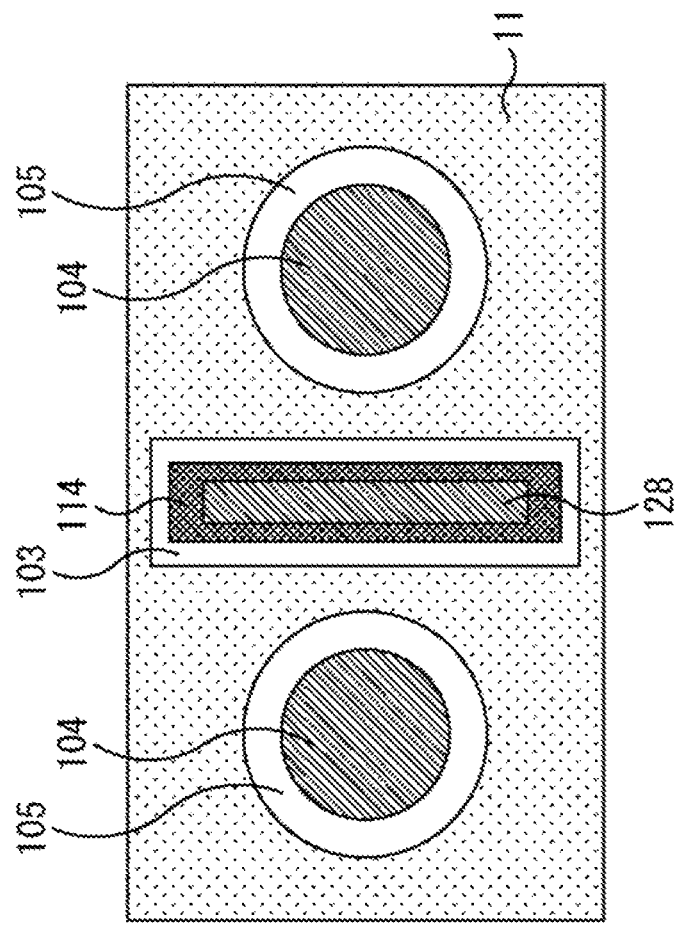
FIG. 12 is a top diagram depicting an exemplary structure of a pixel in a third embodiment of the solid-state imaging element to which this technique is applied.

FIG. 12 is a top diagram depicting an exemplary structure of a pixel of a third embodiment of the solid-state imaging element to which this technique is applied.

In the structure of the pixel in FIG. 12, only the point that the contact 128 is disposed in a line between the penetrating electrodes 104 differs from the structure of the pixel in FIG. 11, and the other portion of the structure is basically common to the structure of the pixel in FIG. 2.

In other words, the structure of the pixel depicted in FIG. 12 is characterized in that the contact 128 is disposed in a line between the penetrating electrodes 104.

Any capacitance coupling between the penetrating electrodes 104 can thereby be further prevented with the structure of the pixel in FIG. 12 compared to that of the structure of the pixel in FIG. 11.

Figure 13:
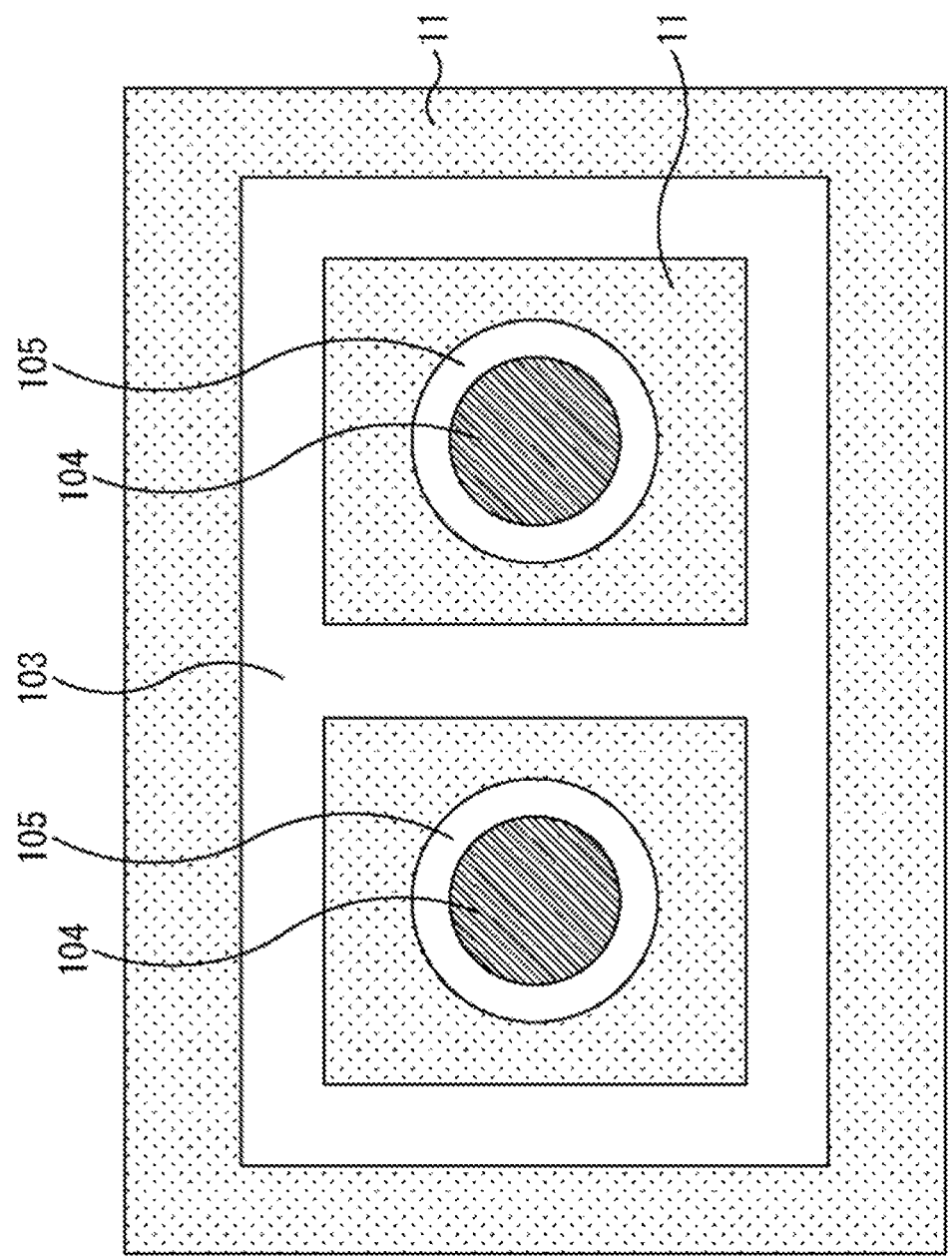
FIG. 13 is a top diagram depicting an exemplary structure of the pixel of a third embodiment of the solid-state imaging element to which this technique is applied.
Figure 14:
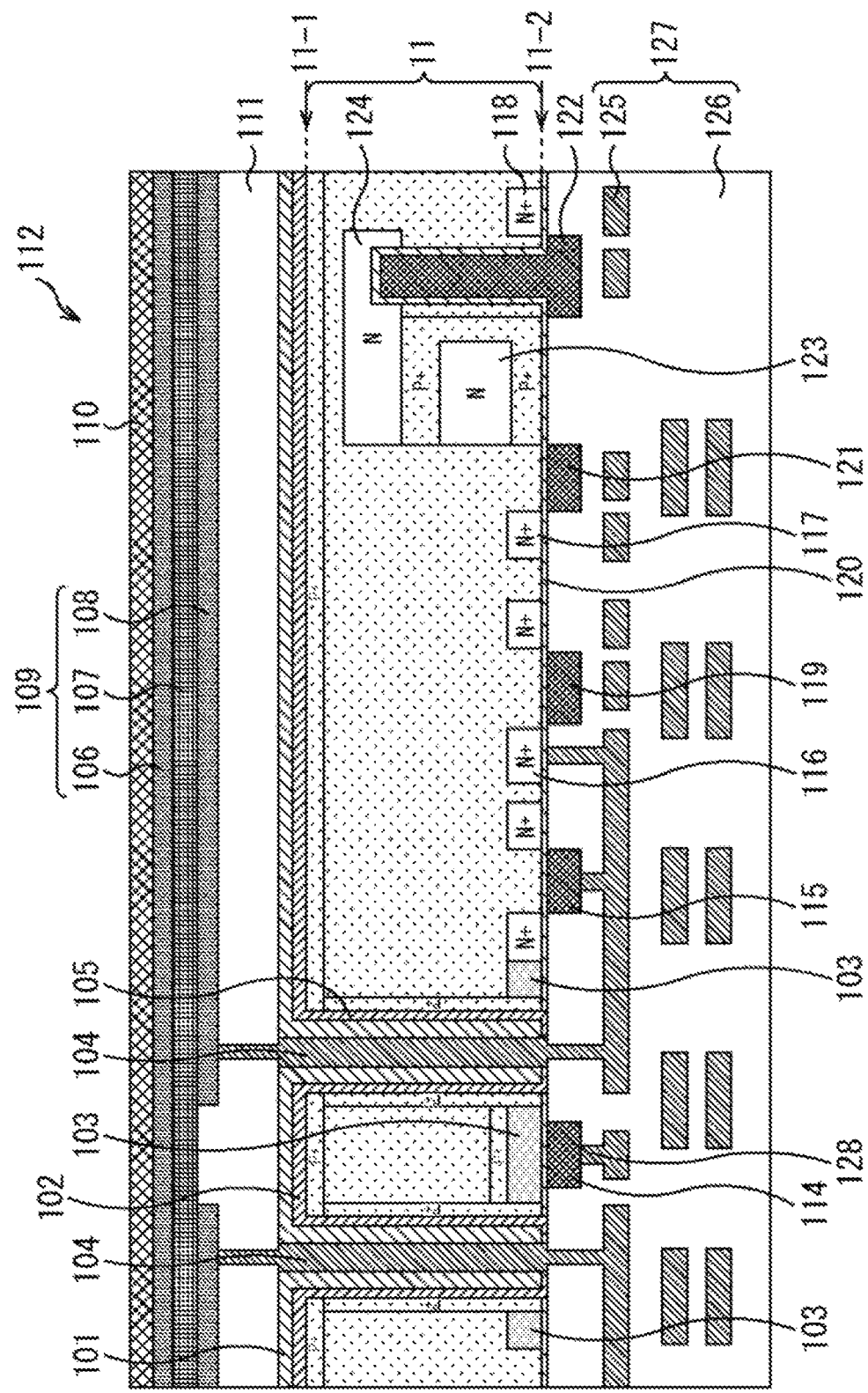
FIG. 14 is a cross-sectional diagram of the structure of the pixel in FIG. 13.

Exemplary Structure of Pixel of Fourth Embodiment of Solid-State Imaging Element FIG. 13 is a top diagram depicting an exemplary structure of a pixel of the third embodiment of the solid-state imaging element to which this technique is applied. FIG. 14 is a cross-sectional diagram of the structure of the pixel in FIG. 13.

In the structure of the pixel in FIG. 13, only the point that the dielectric layer 103 is disposed in the circumference of the penetrating electrodes 104 differs from that of the structure of the pixel in FIG. 2, and the other portion of the structure is basically common to the structure of the pixel in FIG. 2.

In other words, the structure of the pixel depicted in FIG. 13 is characterized in that the dielectric layer 103 is disposed in the circumference of the penetrating electrodes 104.

The pixel thereby tends to avoid any short-circuiting with any element other than the penetrating electrode 104 in the structure of the pixel in FIG. 13 compared to that of the structure of the pixel in FIG. 2, and the pixel size can further be reduced.

Exemplary Structure of Pixel of Fifth Embodiment of Solid-State Imaging Element

Figure 15:
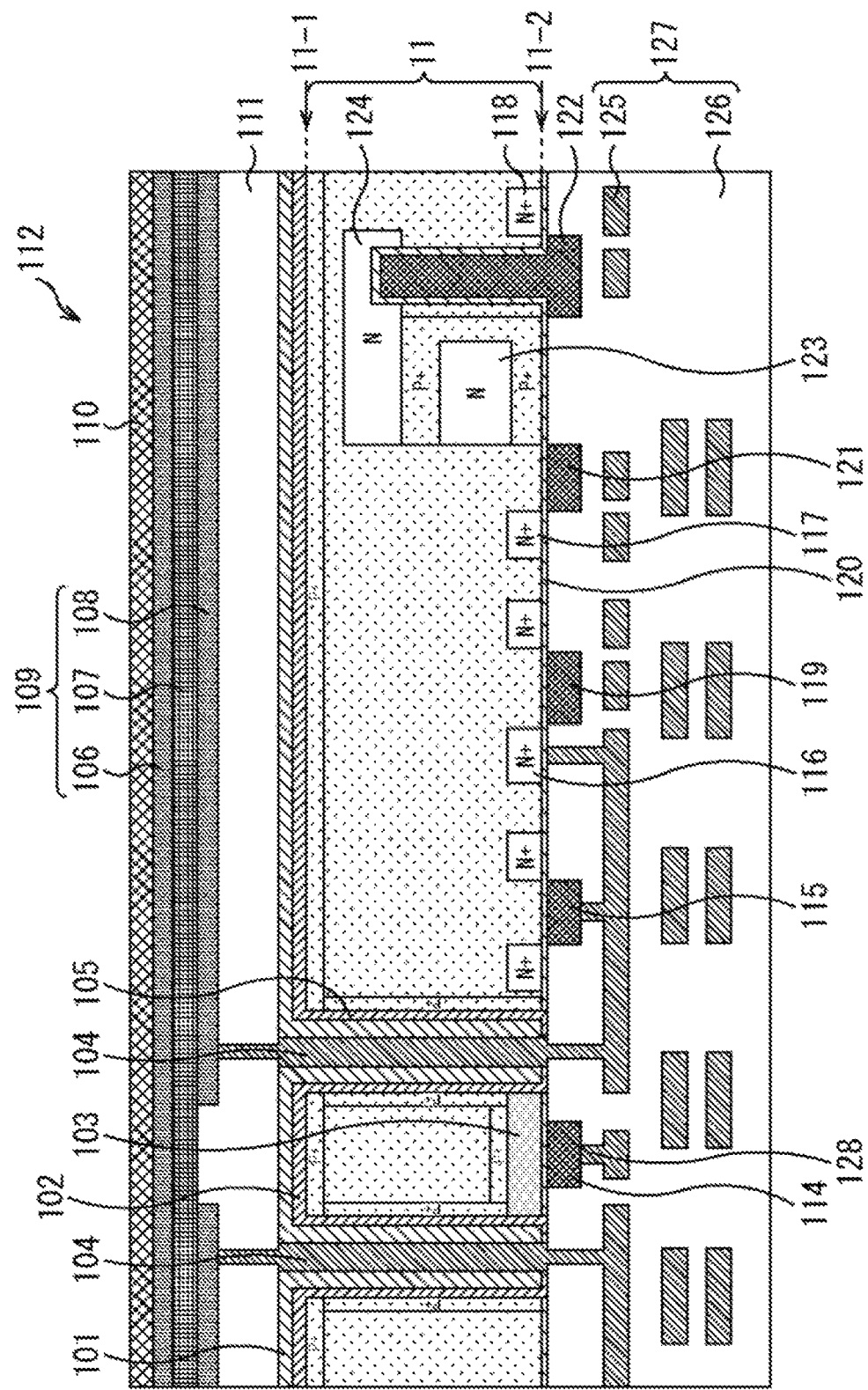
FIG. 15 is a cross-sectional diagram depicting an exemplary structure of a pixel of a fifth embodiment of the solid-state imaging element to which this technique is applied.

FIG. 15 is a cross-sectional diagram depicting an exemplary structure of a pixel of a fifth embodiment of the solid-state imaging element to which this technique is applied.

In the structure of the pixel in FIG. 15, the points that the penetrating electrodes 104 each penetrate the semiconductor substrate 11 and are each isolated from the semiconductor substrate 11 by the isolation trench 105 and that the dielectric layer 103 and the isolation trench 105 are in contact with each other differ from the structure of the pixel in FIG. 2, and the other portion of the structure is basically common to the structure of the pixel in FIG. 2. In other words, the structure of the pixel depicted in FIG. 15 is characterized in that the penetrating electrodes 104 each penetrate the semiconductor substrate 11 and are each isolated from the semiconductor substrate 11 by the isolation trench 105 and that the dielectric layer 103 and the isolation trench 105 are in contact with each other.

The structure of the pixel in FIG. 15 can thereby further reduce the pixel size compared to the structure of the pixel in FIG. 2.

As has been described above, according to this technique, when the penetrating electrodes are formed from the first face of the semiconductor substrate, because the etching rate of the dielectric layer is lower than that of the semiconductor substrate, the dielectric layer tends to avoid being processed, and the diameter of each of the penetrating electrodes is defined in a self-alignment manner by the dielectric layer. In this technique, the penetrating electrodes and the shielded electrode therefore tends to avoid short-circuiting with each other because the shielded electrode is disposed on the dielectric layer.

As a result, the element layout area can further be reduced and effects can therefore be expected that the pixel size can be set to further be minute and that the saturation signal amount and the sensitivity property can be improved.

In this embodiment, to reduce the dark current and white points, the P-type impurity region is disposed in the semiconductor substrate on the outer side face of the dielectric layer. In addition, the dielectric layer is disposed beneath the shielded electrode and thereby the hole accumulation layer can be formed in the semiconductor substrate on the outer side face of the dielectric layer under the condition that a positive bias is applied to the shielded electrode.

2. Use Examples of Image Sensor

Figure 16:
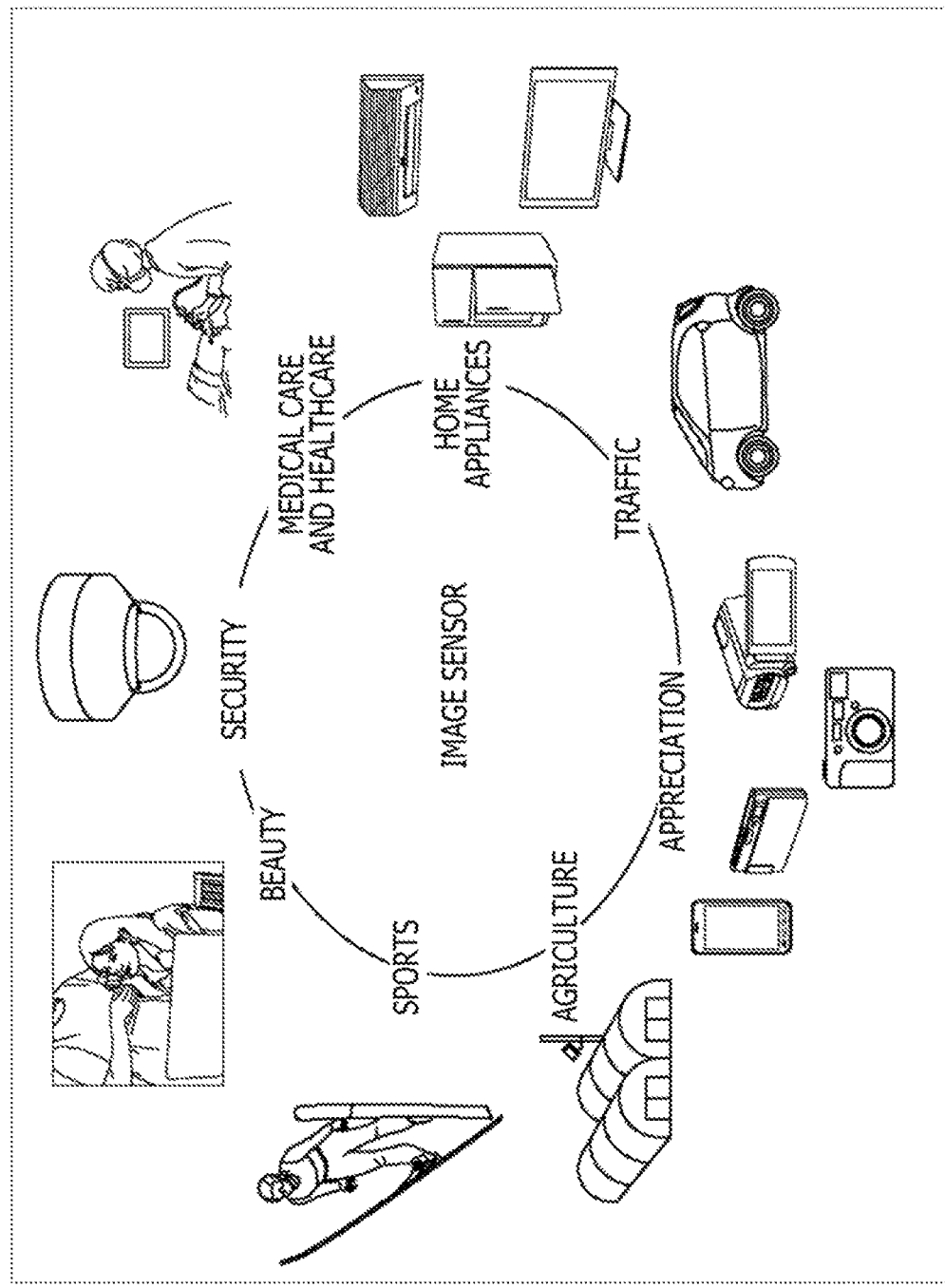
FIG. 16 is a diagram depicting a use example of an image sensor to which this technique is applied.

FIG. 16 is a diagram depicting a use example of using the above solid-state imaging element.

The above solid-state imaging element (an image sensor) is usable in various cases such as, for example, sensing light such as visible light, infrared light, ultraviolet light, and an X-ray, as below.

Apparatuses each photographing images that are used to be appreciated, such as a digital camera, a mobile device with a camera function, and the like.

Apparatuses for traffic-related uses such as: on-vehicle sensors that each photograph the sceneries in front of a motor vehicle, around the motor vehicle, inside the motor vehicle, or the like for safe driving such as automatic stopping and the like and for recognizing the state of the driver, and the like; a surveillance camera for surveilling running vehicles and roads; a distance measuring sensor executing measurement of the distance between vehicles, and the like; and the like.

Apparatuses used in home appliances such as a TV, a refrigerator, an air-conditioner, and the like, each to photograph a gesture of a user and operate a device in accordance with the gesture.

Apparatuses for medical care uses and healthcare uses such as endoscopes, apparatuses each photographing blood vessels by receiving infrared light, and the like.

Apparatuses for security uses such as a surveillance camera for crime prevention, a camera for person authentication, and the like.

Apparatuses for beauty uses such as a skin measuring device photographing the skin, a microscope photographing the skin of a scalp, and the like.

Apparatuses for sport uses such as an action camera, a wearable camera, and the like directed to sport uses and the like.

Apparatuses for agricultural uses such as a camera for surveilling the state of agricultural fields and crops.

3. Example of Electronic Device

<Exemplary Configuration of Electronic Device>

Furthermore, this technique is not limited to its application to the solid-state imaging element and is applicable to an imaging apparatus. Concerning this, the imaging apparatus refers to a camera system such as a digital still camera, a digital video camera, or the like, and an electronic device that has an imaging function, such as a mobile phone, or the like. In addition, a module-like form, that is, a camera module mounted on an electronic device may be handled as the imaging apparatus.

Concerning the above, an exemplary configuration of an electronic device of this technique will be described with reference to FIG. 17.

Figure 17:
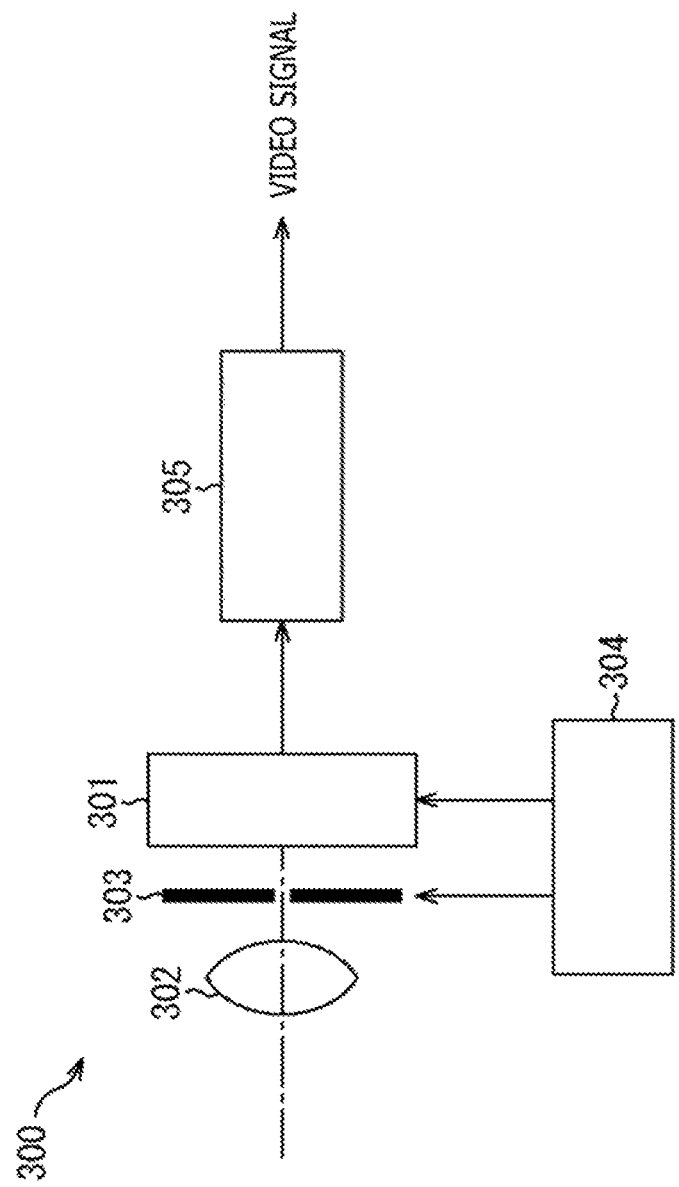
FIG. 17 is a block diagram depicting an exemplary configuration of an electronic device to which this technique is applied.

The electronic device 300 depicted in FIG. 17 includes a solid-state imaging element (an electronic chip) 301, an optical lens 302, a shutter apparatus 303, a driving circuit 304, and a signal processing circuit 305. The above solid-state imaging element 1 of this technique is disposed as the solid-state imaging element 301.

The optical lens 302 causes image light (incident light) from an object to provides an image on an imaging face of the solid-state imaging element 301. A signal charge is thereby accumulated in the solid-state imaging element 301 for a specific time period. The shutter apparatus 303 controls the light irradiation time period and the light blocking time period for the solid-state imaging element 301.

The driving circuit 304 supplies driving signals that each control a signal transfer operation of the solid-state imaging element 301, a shutter operation of the shutter apparatus 303, and a light emission operation of a light emitting part not depicted. The driving circuit 304 controls the operations using parameters set by a CPU not depicted. The solid-state imaging element 301 executes the signal transfer in accordance with the driving signal (a timing signal) supplied from the driving circuit 304. The signal processing circuit 305 executes various types of signal processing for the signals output from the solid-state imaging element 301. A video image signal for which the signal processing is executed is stored in a storage medium such as a memory, or is output to a monitor.

4. Application Example for In-Vivo Information Acquisition System

The technique according to this disclosure (this technique) is applicable to various products. For example, the technique according to this disclosure may be applied to an endoscopic surgery system.

Figure 18:
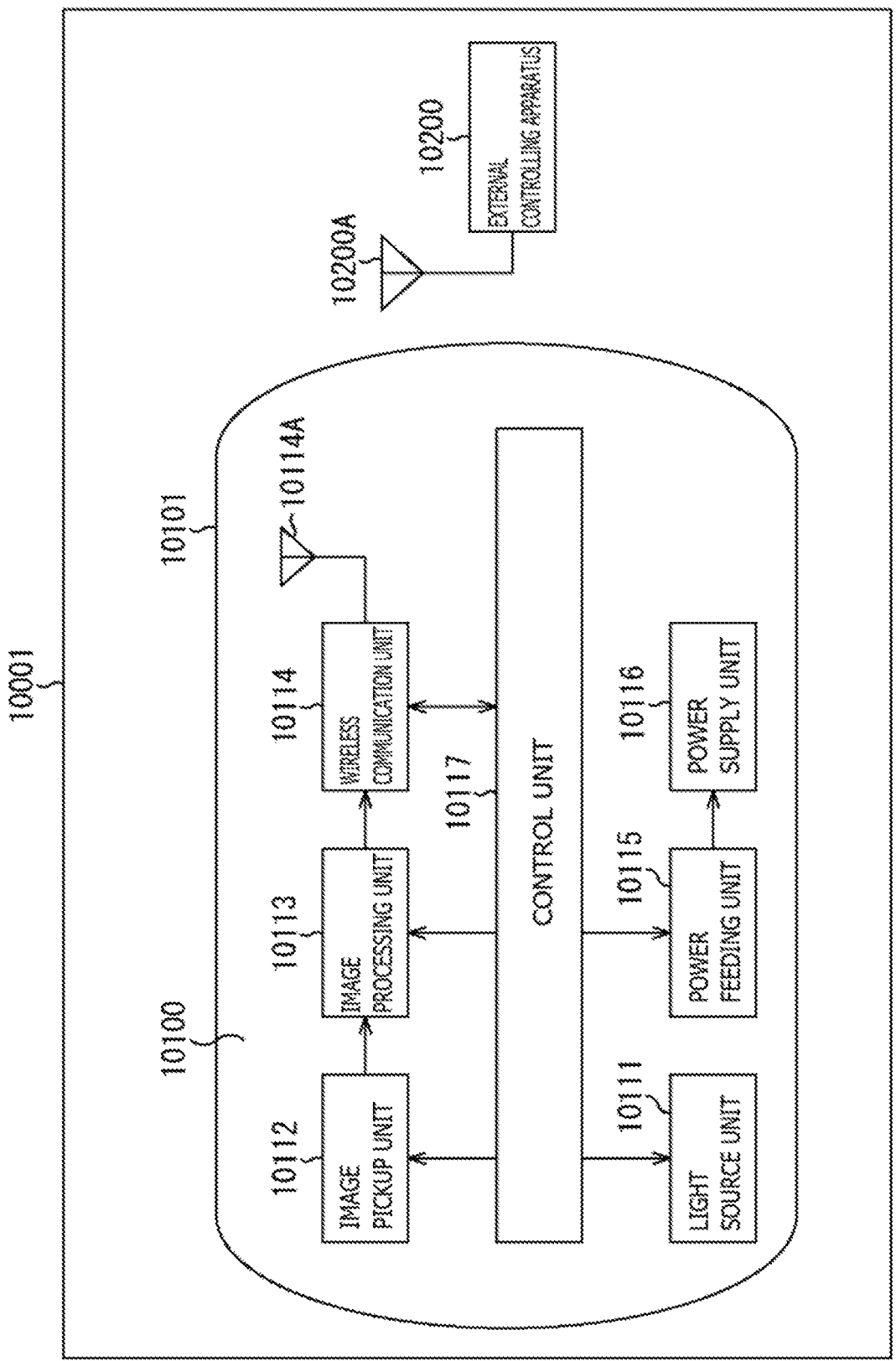
FIG. 18 is a block diagram depicting an example of a schematic configuration of an in-vivo information acquisition system.

FIG. 18 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

Figure 19:
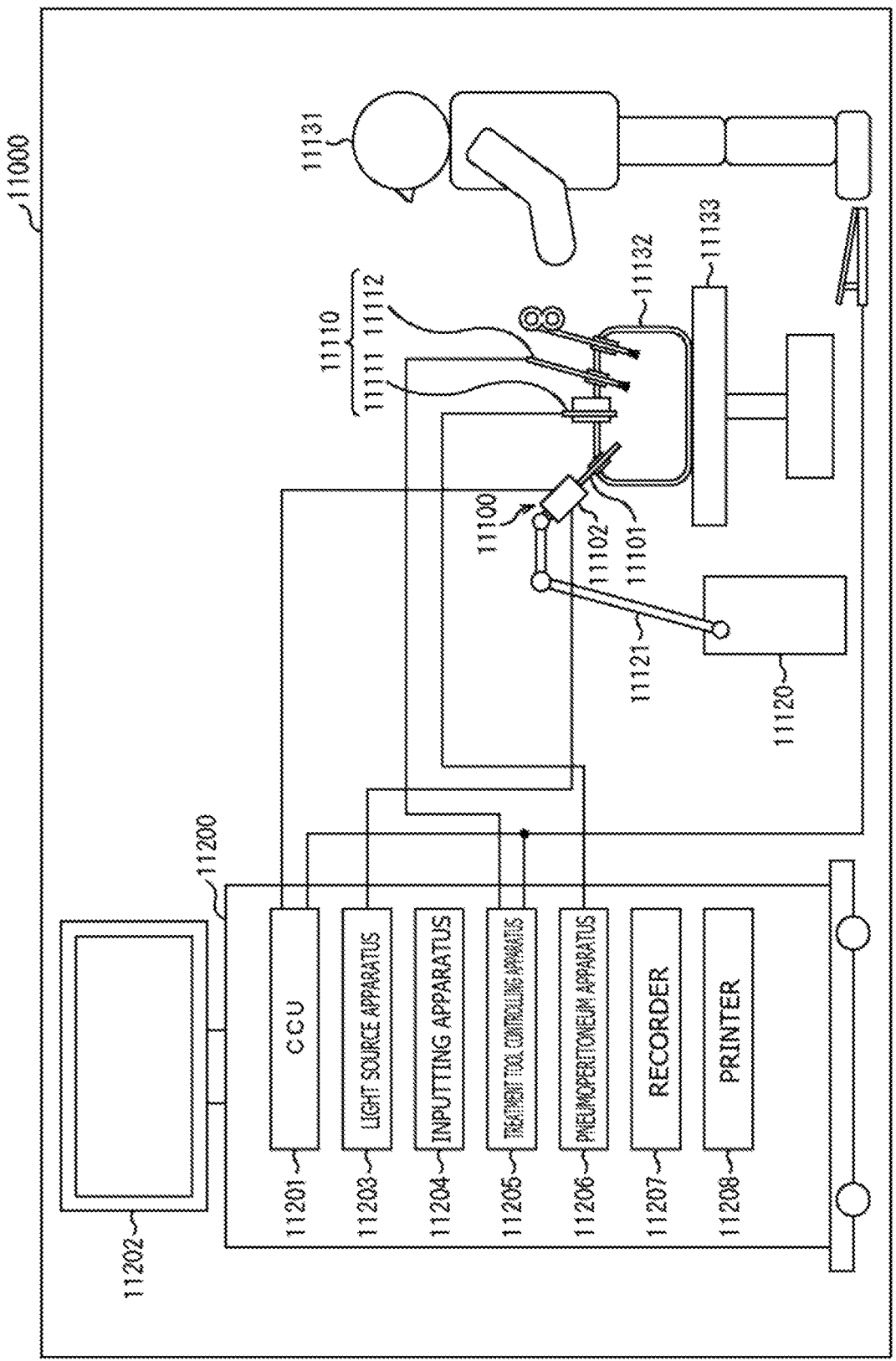
FIG. 19 is a view depicting an example of a schematic configuration of an endoscopic surgery system.

The power supply unit 10116 includes a secondary battery and stores electric power generated by the power feeding unit 10115. In FIG. 19, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

As above, an example of the in-vivo information acquisition system has been described to which the technique according to this disclosure is applicable. The technique according to this disclosure is applicable to the image pickup unit 10112 of the configuration described above. For example, the solid-state imaging element 1 in FIG. 1 is applicable to the image pickup unit 10112. Application of the technique according to this disclosure to the image pickup unit 10112 enables further reduction of the element layout area, and effects are expected that the pixel size can be set to further be minute and that the saturation signal amount and the sensitivity property can be improved.

5. Application Example for Endoscopic Surgery System

The technique according to this disclosure (this technique) is applicable to various products. For example, the technique according to this disclosure may be applied to an endoscopic surgery system.

FIG. 19 is a view depicting an example of a schematic configuration of an endoscopic surgery system to which the technology according to an embodiment of the present disclosure (present technology) can be applied.

In FIG. 19, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 20:
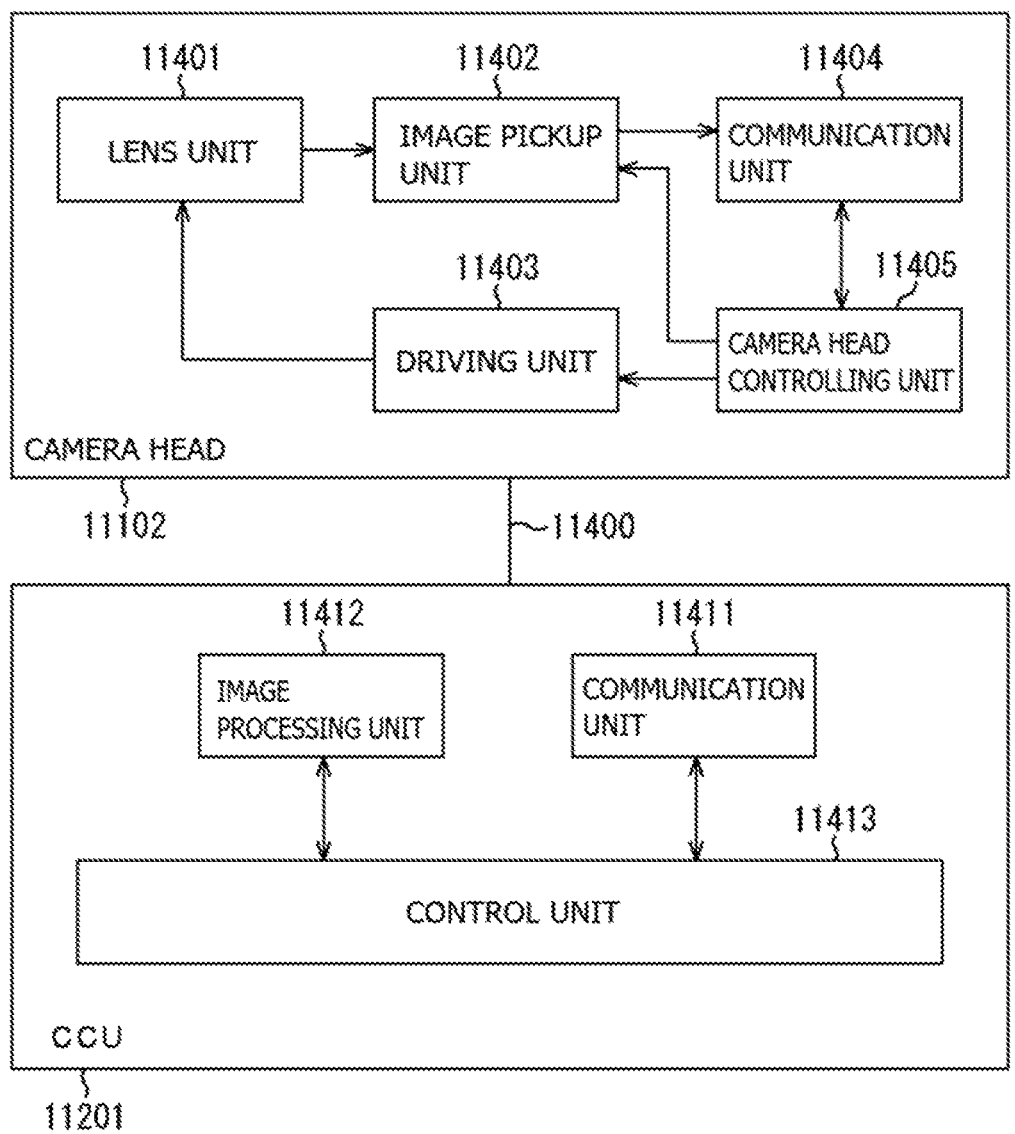
FIG. 20 is a block diagram depicting an example of a functional configuration of a camera head and a camera control unit (CCU).

FIG. 20 is a block diagram depicting an example of a functional configuration of the camera head 11102 and the CCU 11201 depicted in FIG. 19.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

As above, an example of the endoscopic surgery system to which the technique according to this disclosure is applicable has been described. The technique according to this disclosure is applicable to the endoscope 11100 and (the image pickup unit 11402 of) the camera head 11102, of the configuration described above. For example, the solid-state imaging element 1 in FIG. 1 can further reduce the element layout area and effects are therefore expected that the pixel size can be set to further be minute and that the saturation signal amount and the sensitivity property are improved, by applying the technique according to this disclosure to the endoscope 11100 and (the image pickup unit 11402 of) the camera head 11102. The endoscope 11100 and (the image pickup unit 11402 of) the camera head 11102.

In addition, the endoscopic surgery system has been described as an example in the above while the technique according to this disclosure may be applied to, in addition, for example, a microscopic surgery system and the like.

6. Application Example for Mobile Body

The technique according to this disclosure (this technique) is applicable to various products. For example, the technique according to this disclosure may be realized as an apparatus to be mounted on any one type of mobile body such as a motor vehicle, an electric motor vehicle, a hybrid electric motor vehicle, a motorcycle, a bicycle, a personal mobility, an airplane, a drone, a ship, or a robot.

Figure 21:
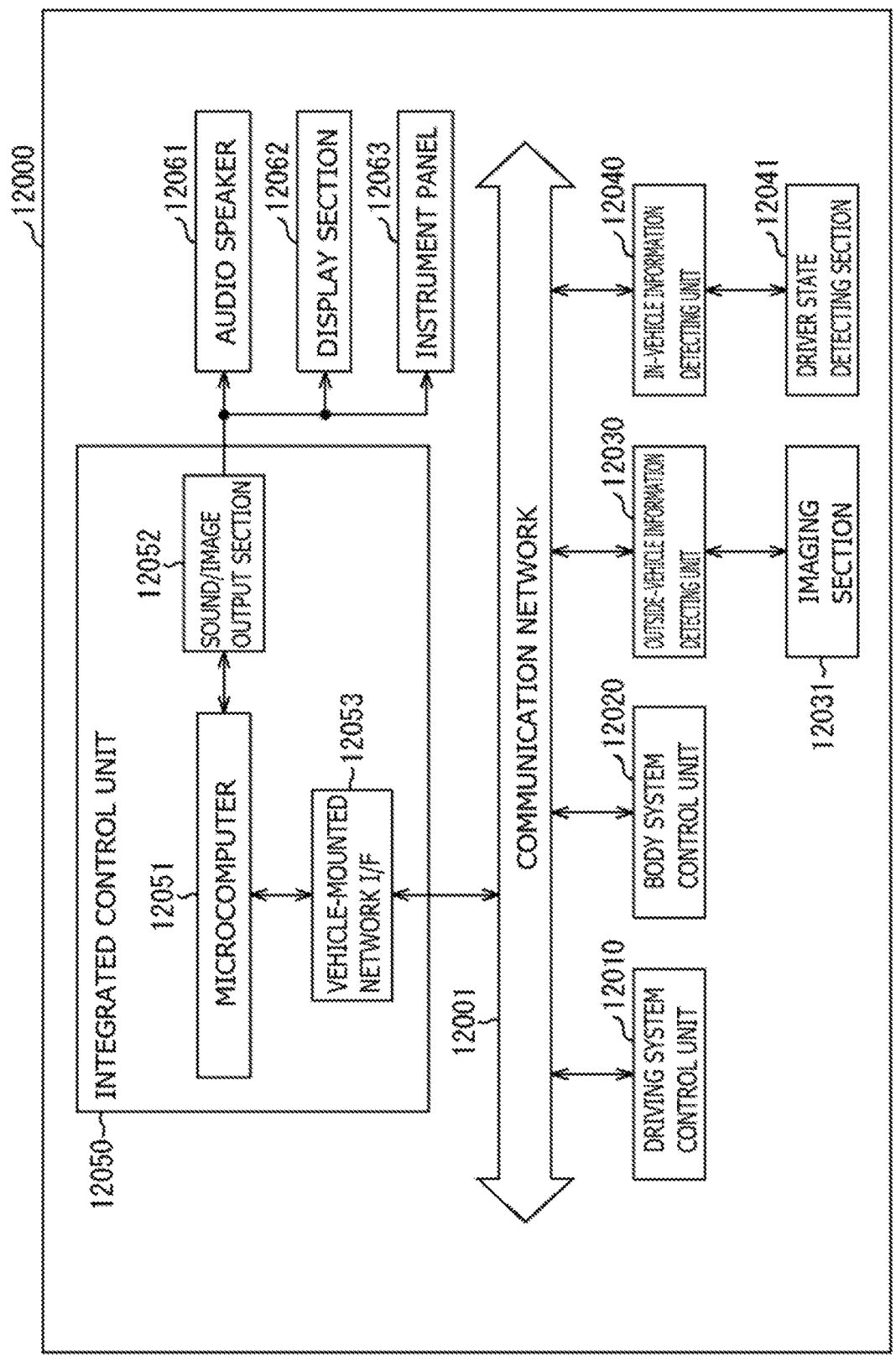
FIG. 21 is a block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
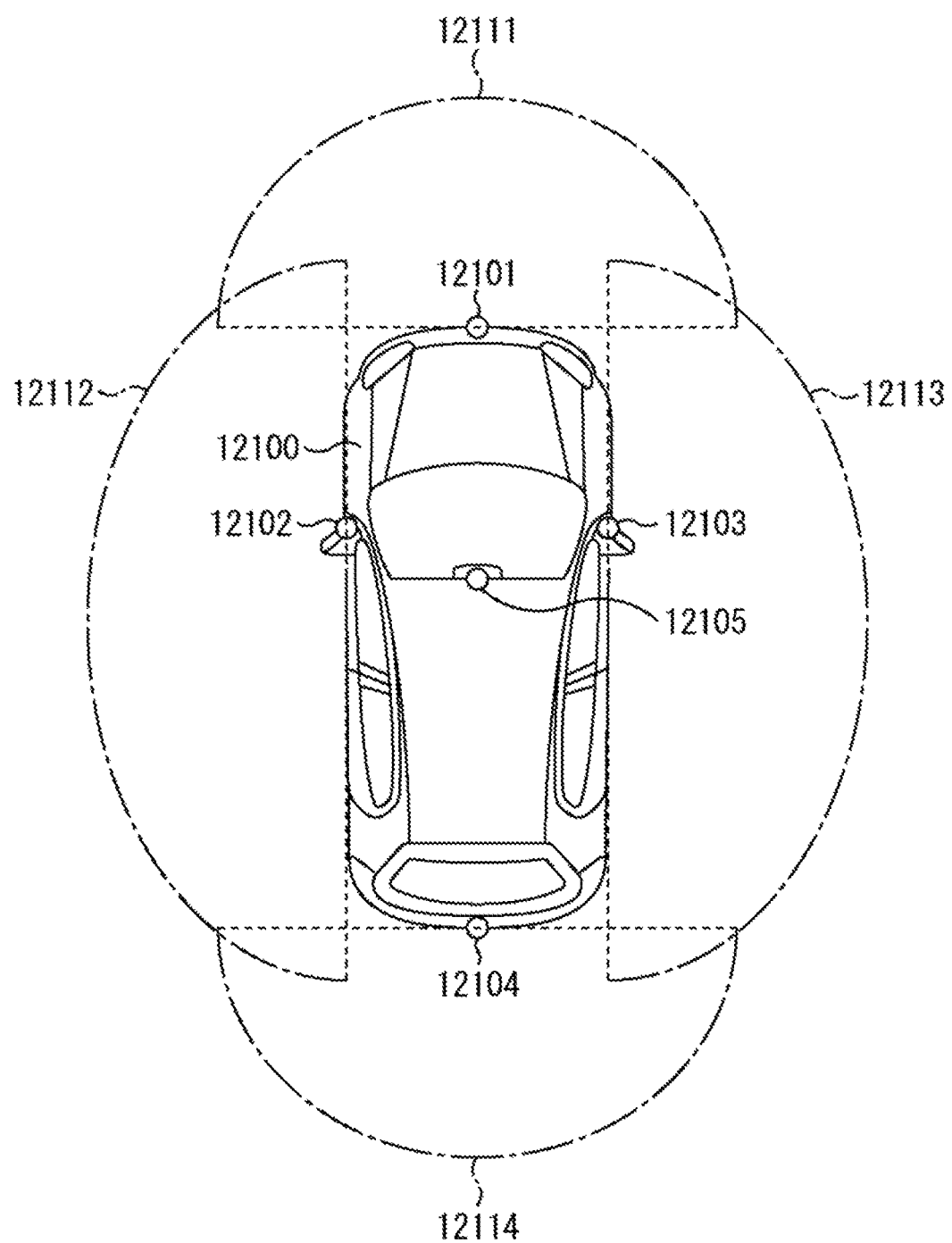
FIG. 22 is a diagram of assistance in explaining an example of installation positions of an outside-vehicle information detecting section and an imaging section.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As above, an example of the vehicle control system to which the technique according to this disclosure is applicable has been described. The technique according to this disclosure is applicable to the imaging section 12031 (including the imaging sections 12101 to 12104) of the configuration described above. More specifically, the solid-state imaging element 1 in FIG. 1 is applicable to the imaging section 12031 (including the imaging sections 12101 to 12104). Further reduction of the element layout area is enabled and effects are expected that the pixel size can be set to further be minute and that the saturation signal amount and the sensitivity property are improved, by applying the technique according to this disclosure to the imaging section 12031 (including the imaging sections 12101 to 12104).

7. Exemplary Configuration of Laminated Solid-State Imaging Element

<Exemplary Cross-Sectional Configuration of Solid-State Imaging Apparatus Including Pixels Each Including Stacked Photoelectric Conversion Parts, to which Technique According to this Disclosure is Applicable>

Figure 23:
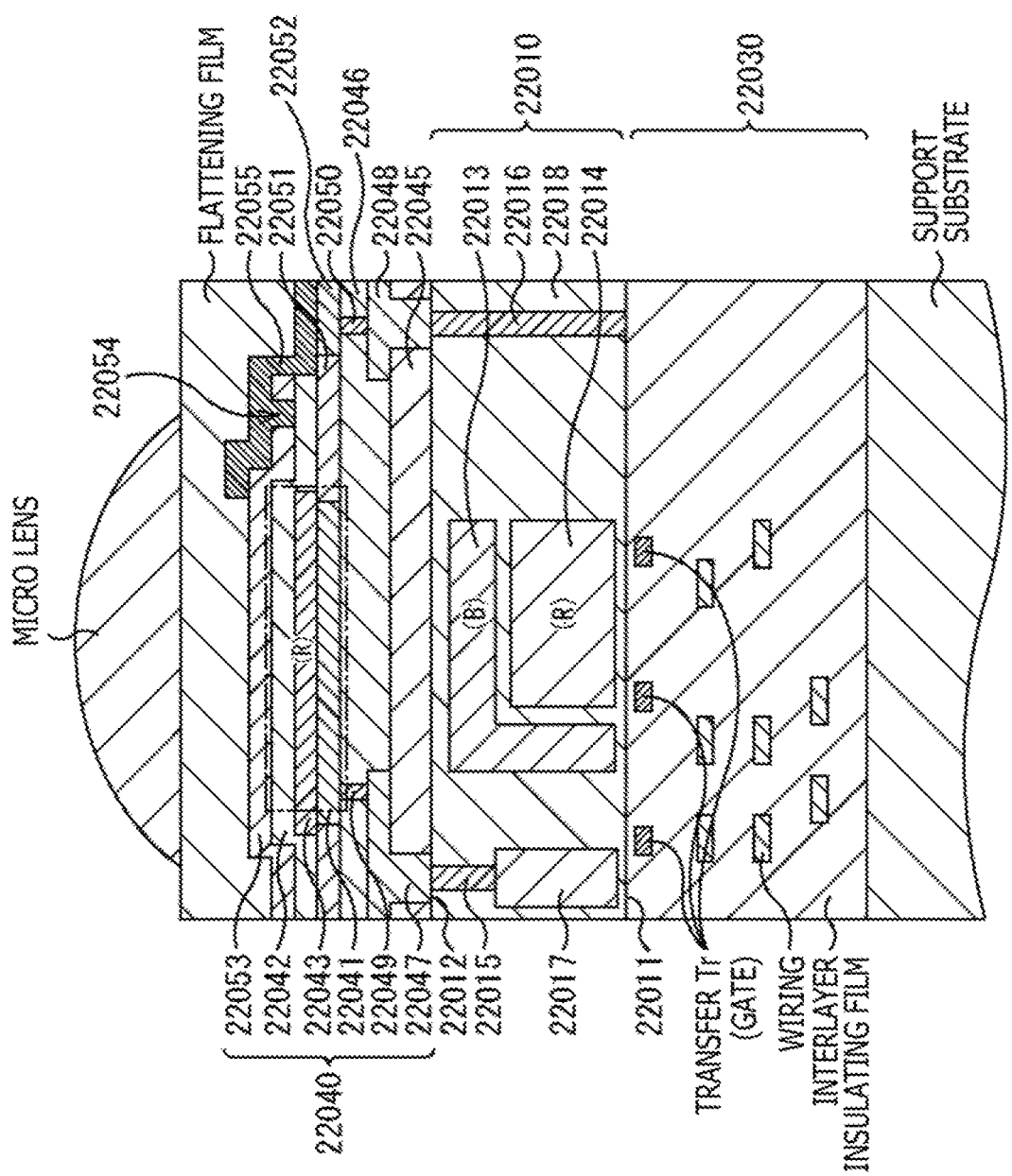
FIG. 23 is a cross-sectional diagram depicting an exemplary configuration of a solid-state imaging apparatus that includes pixels each having photoelectric conversion parts stacked on each other therein, to which the technique according to this disclosure is applicable.

FIG. 23 is a cross-sectional diagram depicting an exemplary configuration of a solid-state imaging apparatus that includes pixels each having the photoelectric conversion parts stacked on each other therein, to which the technique according to this disclosure is applicable.

In other words, FIG. 23 depicts an exemplary configuration of one pixel of the solid-state imaging apparatus including the pixels each including the stacked photoelectric conversion parts.

For the solid-state imaging apparatus, a multi-layer wiring layer 22030 having a transfer Tr (a MOS FET) and the like formed therein is disposed on the side of a face 22011 that is the front face of a semiconductor substrate 22010 and that is on the opposite side to a light-receiving face thereof.

In FIG. 23, the solid-state imaging apparatus has a laminated structure having one organic photoelectric conversion part 22040 and two inorganic photoelectric conversion parts 22013 and 22014 that each selectively detect a light beam in a wavelength region different from that of each other and that each execute photoelectric conversion, stacked on each other in the vertical direction, and the organic photoelectric conversion part 22040 includes, for example, three types of organic semiconductor material.

Each one element (each one pixel) can acquire a red, a green, and a blue color signals by the stacking of the two inorganic photoelectric conversion parts 22013 and 22014, and the one organic photoelectric conversion part 22040 on each other as above. The organic photoelectric conversion part 22040 is formed on a face 22012 that is the back face of the semiconductor substrate 22010, and the inorganic photoelectric conversion parts 22013 and 22014 are formed in a form of being buried in the semiconductor substrate 22010.

The organic photoelectric conversion part 22040 includes an organic photoelectric conversion element that absorbs a light beam in a selective wavelength region, that is, a green light beam in this case and that generates an electron-hole pair, using an organic semiconductor. The organic photoelectric conversion part 22040 has a configuration that has the organic photoelectric conversion layer (the organic semiconductor layer) 22043 sandwiched between a lower portion electrode 22041 and an upper portion electrode 22042 that are a pair of electrodes to extract the signal charge. The lower portion electrode 22041 and the upper portion electrode 22042 are electrically connected to conductive plugs 22015 and 22016 buried in the semiconductor substrate 22010 through a wiring layer and a contact metal layer.

Interlayer insulating films 22045 and 22046 are formed on the face 22012 of the semiconductor substrate 22010 in the organic photoelectric conversion part 22040. A through-hole is disposed in a region facing each of the conductive plugs 22015 and 22016 in the interlayer insulating film 22045. The conductive plugs 22047 and 22048 are buried each in one of the through-holes. Wiring layers 22049 and 22050 are buried each in a region facing one of the conductive plugs 22047 and 22048 in the interlayer insulating film 22046. On the interlayer insulating film 22046, the lower portion electrode 22041 is disposed and a wiring layer 22052 is disposed that is electrically isolated from the lower portion electrode 22041 by an insulating film 22051. Of these, an organic photoelectric conversion layer 22043 is formed on the lower portion electrode 22041, and the upper portion electrode 22042 is formed to cover the organic photoelectric conversion layer 22043. On the upper portion electrode 22042, a protective film 22053 is formed to cover the surface thereof. A contact hole 22054 is disposed in a predetermined region of the protective film 22053, and a contact metal layer 22055 that buries the contact hole 22054 and that extends to the upper face of the wiring layer 22052 is formed on the protective film 22053.

The conductive plug 22047 together with the conductive plug 22015 functions as a connector, and forms a transmission path for the charges (electrons) from the lower portion electrode 22041 to a green capacitor layer 22017 together with the conductive plug 22015 and the wiring layer 22049. The conductive plug 22048 together with the conductive plug 22016 functions as a connector, and forms a discharge path for the charges (holes) from the upper portion electrode 22042 together with the conductive plug 22016, the wiring layer 22050, the wiring layer 22052, and the contact metal layer 22055. The conductive plugs 22047 and 22048 can each include a laminated film of a metal materials such as, for example, titanium (Ti), titanium nitride (TiN), tungsten, and the like to each be caused to also function as a light-blocking film. Moreover, the contact with silicon can be secured even in the case where the conductive plugs 22015 and 22016 are formed each as an n-type or a p-type semiconductor layer, by using the above laminated films.

The interlayer insulating film 22045 can include an insulating film whose interface state is low, to lower the interface state with a silicon layer 22018 of the semiconductor substrate 22010 and to suppress generation of any dark current from the interface with the silicon layer 22018. For example, a laminated film including a hafnium oxide (HfO2) film and a silicon dioxide (SiO2) film is usable as such an insulating film. The interlayer insulating film 22046 can include a single layer film including one of, for example, silicon dioxide, silicon nitride, silicon oxynitride (SiON), and the like, or a laminated film including two or more of the above.

The insulating film 22051 includes a single layer film including one of, for example, silicon dioxide, silicon nitride, silicon oxynitride (SiON), and the like, or a laminated film including two or more of the above. The insulating film 22051 has, for example, a flattened surface, and has a shape and a pattern that form substantially no gap with the lower portion electrode 22041. The insulating film 22051 has a function of electrically isolating the lower portion electrodes 22041 from each other, of the pixels of the solid-state imaging apparatus.

The lower portion electrode 22041 exactly faces light-receiving faces of the inorganic photoelectric conversion parts 22013 and 22014 formed in the semiconductor substrate 22010 and is disposed in a region covering these light-receiving faces. The lower portion electrode 22041 includes a conductive film having a light-transmission property and includes, for example, indium tin oxide (ITO). In addition to ITO, however, a tin dioxide (SnO2)-based material having a dopant added thereto or a zinc oxide-based material formed by adding a dopant to aluminum zinc oxide (ZnO) may be used as the constituent material of the lower portion electrode 22041. Examples of the zinc oxide-based material include, for example, aluminum zinc oxide (AZO) having aluminum (Al) added thereto as a dopant, gallium zinc oxide (GZO) having gallium (Ga) added thereto, and indium zinc oxide (IZO) having indium (In) added thereto. Moreover, in addition, CuI, InSbO4, ZnMgO, CuInO2, MgIN2O4, CdO, ZnSnO3, and the like may be used. In addition, in FIG. 23, the signal charge (electrons) acquired by the organic photoelectric conversion layer 22043 is extracted from the lower portion electrode 22041, and the lower portion electrode 22041 is therefore formed being isolated for each of the pixels.

The organic photoelectric conversion layer 22043 includes, for example, three types of material that are a first organic semiconductor material, a second organic semiconductor material, and/or a third organic semiconductor material and any one of these three types of organic semiconductor material is one or both of an organic p-type semiconductor and an organic n-type semiconductor. The organic photoelectric conversion layer 22043 photoelectric-converts a light beam in a selective wavelength region and, on the other hand, transmits any light beam in other wavelength regions. More specifically, the organic photoelectric conversion layer 22043 has its maximum absorption wavelength in, for example, a range from 450 to 650 nm as the wavelength of a green light beam.

Other layers not depicted may be disposed between the organic photoelectric conversion layer 22043 and the lower portion electrode 22041, and between the organic photoelectric conversion layer 22043 and the upper portion electrode 22042. For example, an undercoat film, a hole transport layer, an electron blocking film, the organic photoelectric conversion layer 22043, a hole blocking film, a buffer film, an electron transport layer, and a work function adjusting film may be stacked in this order from the side of the lower portion electrode 222041.

The upper portion electrode 22042 includes a conductive film having a light-transmission property that is similar to that of the lower portion electrode 22041. The upper portion electrode 22042 may be isolated for each of the pixels, or may be formed as an electrode common to the pixels. The thickness of the upper portion electrode 22042 is, for example, 10 to 200 nm.

The protective film 22053 includes a material having a light-transmission property and is a single layer film including any one of, for example, silicon dioxide, silicon nitride, silicon oxynitride, and the like, or a laminated film including two or more of the above. The thickness of the protective film 22053 is, for example, 100 to 30,000 nm.

The contact metal layer 22055 includes, for example, any one of titanium, tungsten, titanium nitride, aluminum, and the like, or a laminated film including two or more of these.

The inorganic photoelectric conversion parts 22013 and 22014 are each a PD (photodiode) having a pn-junction therein, and are formed in order of the inorganic photoelectric conversion parts 22013 and 22014 from the side of the face 22012 in the optical path in the semiconductor substrate 22010. The inorganic photoelectric conversion part 22013 selectively detects a blue light beam and accumulates therein the signal charge corresponding to the blue color. The inorganic photoelectric conversion part 22013 is formed to extend, for example, from a selective region along the face 22012 of the semiconductor substrate 22010 to a region in the vicinity of the interface with the multi-layer wiring layer 22030. The inorganic photoelectric conversion part 22014 selectively detects a red light beam and accumulates therein the signal charge corresponding to the red color. The inorganic photoelectric conversion part 22014 is formed over, for example, a region in a lower layer lower than the inorganic photoelectric conversion part 22013 (the side of the face 22011). In addition, blue is a color corresponding to a wavelength region of, for example, 450 to 495 nm and red is a color corresponding to a wavelength region of, for example, 620 to 750 nm, and the inorganic photoelectric conversion parts 22013 and 22014 each only have to be able to detect the light beam in a portion or the whole of wavelength region of the above wavelength region.

The pixel in FIG. 23 has a laminated structure having the organic photoelectric conversion part 22040 and the two inorganic photoelectric conversion parts 22013 and 22014 stacked on each other in the vertical direction, and the organic photoelectric conversion part 22040, the inorganic photoelectric conversion part 22013, and the inorganic photoelectric conversion part 22014 respectively absorb (detect) and photoelectric-convert a green light beam, a blue light beam, and a red light beam. Each one of the pixels can therefore execute vertical optical dispersion in the vertical (layer) direction and can acquire the signals for the colors of red, green, and blue.

The technique according to this disclosure is applicable to the solid-state imaging apparatus as above.

<Exemplary Plan Configuration of Solid-State Imaging Apparatus Including Pixels Each Having Photoelectric Conversion Parts Stacked on Each Other Therein to which Technique According to this Disclosure is Applicable>

Figure 24:
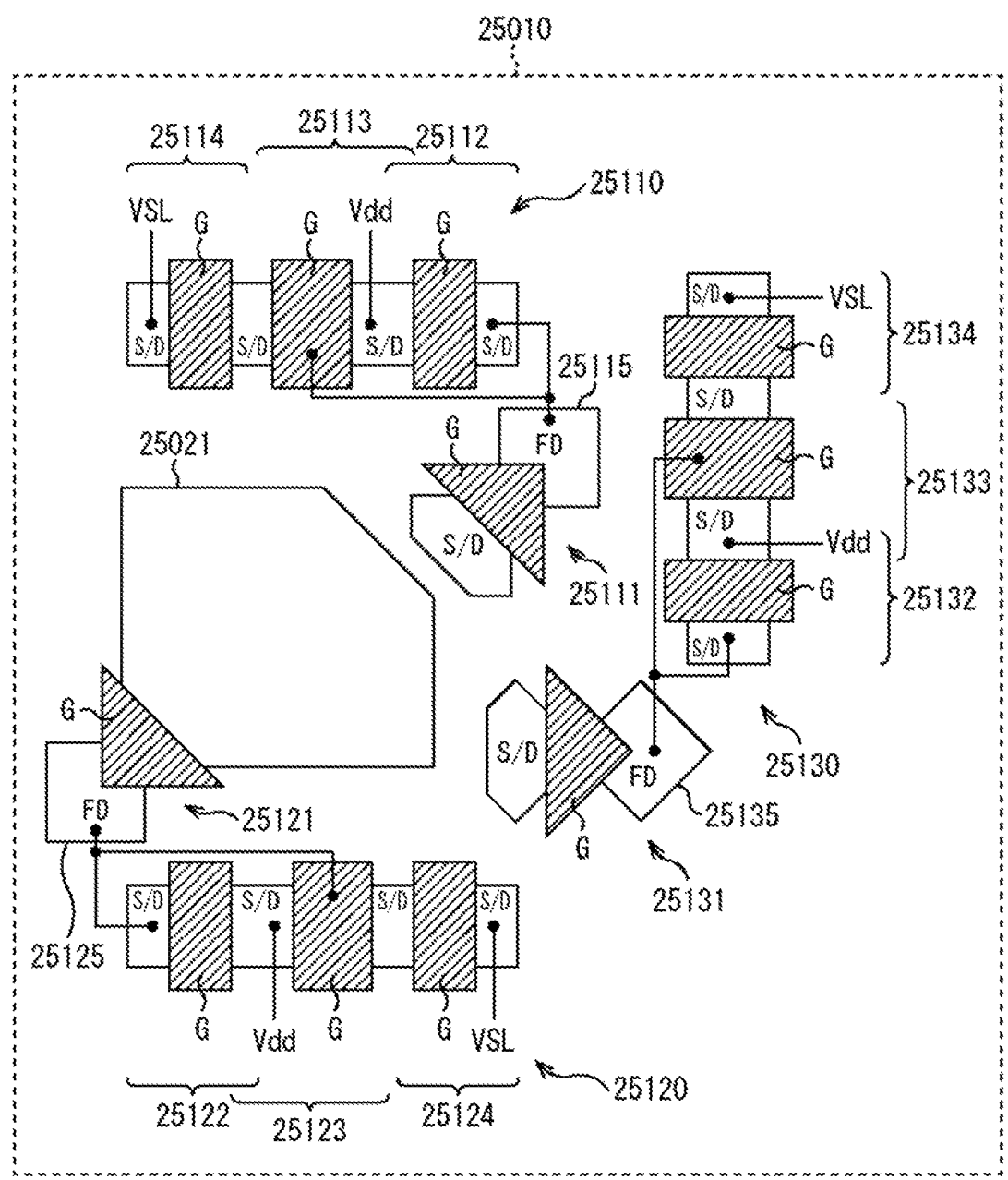
FIG. 24 is a plan diagram depicting an exemplary configuration of the solid-state imaging apparatus that includes the pixels each having the photoelectric conversion parts stacked on each other therein, to which the technique according to this disclosure is applicable.

FIG. 24 is a plan diagram depicting an exemplary configuration of the solid-state imaging apparatus that includes the pixels each having the photoelectric conversion parts stacked on each other therein, to which the technique according to this disclosure is applicable.

In other words, FIG. 24 depicts an exemplary configuration of one of the pixels of the solid-state imaging apparatus including the pixels each having the photoelectric conversion parts stacked on each other therein.

A pixel 25010 includes a photoelectric conversion region 25021 that has a red color photoelectric conversion part, a green color photoelectric conversion part, and a blue color photoelectric conversion part (all not depicted) respectively photoelectric-converting light beams having wavelengths of R (Red), G (Green), and B (Blue) stacked on each other therein in three layers in order of, for example, the green color photoelectric conversion part, the blue color photoelectric conversion part, and the red color photoelectric conversion part. The pixel 25010 further includes Tr groups 25110, 25120, and 25130 as charge reading parts that read the charges corresponding to the light beams of the wavelengths of R, G, and B respectively from the red color photoelectric conversion part, the green color photoelectric conversion part, and the blue color photoelectric conversion part. In the solid-state imaging apparatus, in the one pixel 25010, the optical dispersion in the vertical direction, that is, optical dispersion of each of the light beams of R, G, and B in the layers as the red color photoelectric conversion part, the green color photoelectric conversion part, and the blue color photoelectric conversion part that are stacked on each other in the photoelectric conversion region 25021 is executed.

The Tr groups 25110, 25120, and 25130 are formed around the photoelectric conversion region 25021. The transistor group 25110 outputs the signal charge corresponding to the R-light beam generated and accumulated by the red color photoelectric conversion part, as a pixel signal. The Tr group 25110 includes a transfer Tr (a MOS FET) 25111, a reset Tr 25112, an amplification Tr 25113, and a selection Tr 25114. The Tr group 25120 outputs the signal charge corresponding to the G-light beam generated and accumulated by the green color photoelectric conversion part, as a pixel signal. The Tr group 25120 includes a transfer Tr 25121, a reset Tr 25122, an amplification Tr 25123, and a selection Tr 25124. The Tr group 25130 outputs the signal charge corresponding to the B-light beam generated and accumulated by the blue color photoelectric conversion part, as a pixel signal. The Tr group 25130 includes a transfer Tr 25131, a reset Tr 25132, an amplification Tr 25133, and a selection Tr 25134.

The transfer Tr 25111 includes a gate G, a source/drain region S/D, and (the source/drain region acting as) an FD (floating diffusion) 25115. The transfer Tr 25121 includes a gate G, (a source/drain region connected to) the green color photoelectric conversion part of the photoelectric conversion region 25021, and an FD 25125. The transfer Tr 25131 includes a gate G, a source/drain region S/D, and an FD 25135. In addition, the source/drain region of the transfer Tr 25111 is connected to the red color photoelectric conversion part of the photoelectric conversion region 25021, and the source/drain region of the transfer Tr 25131 is connected to the blue color photoelectric conversion part of the photoelectric conversion region 25021.

All the reset Trs 25112, 25122, and 25132, the amplification Trs 25113, 25123, and 25133, and the selection Trs 25114, 25124, and 25134 each include the gate G and a pair of the source/drain regions S/D arranged in the form to sandwich the gate G therebetween.

The FDs 25115, 25125, and 25135 are respectively connected to the source/drain regions S/D acting as the sources of the reset Trs 25112, 25122, and 25132, and are also connected respectively to the gates G of the amplification Trs 25113, 25123, and 25133. A power source Vdd is connected to the source/drain regions S/D each common to any one of the reset Tr 25112 and the amplification Tr 25113, the reset Tr 25122 and the amplification Tr 25123, and the reset Tr 25132 and the amplification Tr 25133. A VSL (vertical signal line) is connected to the source/drain regions S/D acting as the sources of the selection Trs 25114, 25124, and 25134.

The technique according to this disclosure is applicable to the solid-state imaging apparatus as above.

In addition, in this specification, the steps describing the series of processes surely include the processes that are executed in chronological order in accordance with the described order and also include the processes that are not necessarily processed in the chronological order but that are executed in parallel to each other or each individually executed.

Moreover, the embodiments in this disclosure are not limited to the above embodiments and various changes can be made thereto within the scope not departing from the gist of this disclosure.

Moreover, in the above, a configuration described as one apparatus (or one processing part) may be divided to be configured as plural apparatuses (or processing parts). In contrast, in the above, configurations described as plural apparatuses (or plural processing parts) may be integrated with each other to be configured as one apparatus (or one processing part). Moreover, needless to say, configurations other than those described above may be added to the configuration of each of the apparatuses (or the processing parts). Furthermore, when the configuration and operation as the overall system are substantially same, a portion of the configuration of one certain apparatus (or one certain processing part) may be included in the configuration of another apparatus (or another processing part). In short, this technique is not limited to the above described embodiments and various changes can be made thereto within the scope not departing from the gist of this technique.

The preferred embodiments of this disclosure have been described in detail with reference to the accompanying drawings as above while the disclosure is not limited to such examples. It is obvious that those who have common knowledge in the technical field to which the present disclosure pertains can anticipate various change examples or various modification examples within the scope of the technical idea described in the appended claims, and it should be understood that these examples also naturally pertain to the technical scope of this disclosure.

Concerning the above, this technique can also take the following configurations.

(1) A solid-state imaging element including:
a photoelectric conversion element that is disposed on a side of a first face of a semiconductor substrate;

penetrating electrodes that are each connected to the photoelectric conversion element, the penetrating electrodes each being disposed between the first face of the semiconductor substrate and a second face thereof that is a face different from the first face;

a transistor and a floating diffusion that are disposed in the second face, the transistor and the floating diffusion being connected to the photoelectric conversion element through the penetrating electrodes; and a dielectric layer that is formed between the penetrating electrodes in the second face, the dielectric layer being thicker than a gate insulating film of the transistor.

(2) The solid-state imaging element described in the above (1), further including a shielded electrode on an inner side of the dielectric layer seen from a side of the second face.

(3) The solid-state imaging element described in the above (2), in which a material of the shielded electrode includes polysilicon or amorphous silicon.

(4) The solid-state imaging element described in the above (2) or (3), in which the shielded electrode is controlled to be at a predetermined voltage from a contact electrically connected to the shielded electrode and wiring electrically connected to the contact.

(5) The solid-state imaging element described in the above (4), in which the contact electrically connected to the shielded electrode is disposed between the penetrating electrodes.

(6) The solid-state imaging element described in the above (4) or (5), in which the contact electrically connected to the shielded electrode is disposed in a line between the penetrating electrodes.

(7) The solid-state imaging element described in any one of the above (1) to (6), in which the dielectric layer is disposed on a circumference of the penetrating electrodes.

(8) The solid-state imaging element described in any one of the above (1) to (7), in which the penetrating electrodes each penetrate the semiconductor substrate and are each isolated from the semiconductor substrate by an isolation trench, and the dielectric layer and the isolation trench are in contact with each other.

(9) The solid-state imaging element described in any one of the above (1) to (7), further including one or a plurality of photodiodes disposed in the semiconductor substrate.

(10) An electronic device including:

a solid-state imaging element that includes a photoelectric conversion element disposed on a side of a first face of a semiconductor substrate, penetrating electrodes that are each connected to the photoelectric conversion element, the penetrating electrodes each being disposed between the first face of the semiconductor substrate and a second face thereof that is a face different from the first face, a transistor and a floating diffusion that are disposed in the second face, the transistor and the floating diffusion being connected to the photoelectric conversion element through the penetrating electrodes, and a dielectric layer that is formed between the penetrating electrodes in the second face, the dielectric layer being thicker than a gate insulating film of the transistor;

a signal processing circuit that processes an output signal output from the solid-state imaging element; and an optical system that emits incident light into the solid-state imaging element.

(11) A fabrication method by a fabricating apparatus, the method including:

forming through-holes between a first face of a semiconductor substrate and a second face thereof that is a face different from the first face;

forming a dielectric layer between the through-holes in the second face, the dielectric layer being thicker than a gate insulating film of a transistor formed in the second face;

forming, in the second face, gate wiring that includes the transistor;

forming penetrating electrodes each by burying a metal material film in each of the through-holes; and forming, in the first face, the photoelectric conversion element that is connected to the transistor and a floating diffusion through the penetrating electrodes.

REFERENCE SIGNS LIST

1 Solid-state imaging element, 2 Pixel, 11 Semiconductor substrate, 11-1 First face, 11-2 Second face, 101 Dielectric, 102 Film, 103 Dielectric layer, 104 Penetrating electrode, 105 Isolation trench, 106 Transparent electrode, 107 Photoelectric conversion film, 108 Transparent electrode, 109 Photoelectric conversion element, 110 Protective film, 111 Interlayer insulating film, 112 Light incident face, 114 Shielded electrode, 115 Amplification transistor, 116 to 118 Floating diffusion, 120 Gate insulating film, 121 Transfer gate, 122 Vertical transfer gate, 123, 124 Photodiode, 125 Wiring layer, 126 Insulating film, 127 Multi-layer substrate, 128 Contact, 129 Reset transistor, 151 Formation scheduled region

What is claimed is:

1. A solid-state imaging element, comprising:
a photoelectric conversion element that is disposed on a side of a first face of a semiconductor substrate;
penetrating electrodes that are each connected to the photoelectric conversion element, the penetrating electrodes each being disposed between the first face of the semiconductor substrate and a second face thereof that is a face different from the first face;
a transistor and a floating diffusion that are disposed in the second face, the transistor and the floating diffusion being connected to the photoelectric conversion element through the penetrating electrodes;
a dielectric layer that is formed between the penetrating electrodes in the second face, the dielectric layer being thicker than a gate insulating film of the transistor; and
a shielded electrode on an inner side of the dielectric layer seen from a side of the second face.

2. The solid-state imaging element according to claim 1, wherein a material of the shielded electrode includes polysilicon or amorphous silicon.

3. The solid-state imaging element according to claim 1, wherein the shielded electrode is controlled to be at a predetermined voltage from a contact electrically connected to the shielded electrode and wiring electrically connected to the contact.

4. The solid-state imaging element according to claim 3, wherein the contact electrically connected to the shielded electrode is disposed between the penetrating electrodes.

5. The solid-state imaging element according to claim 4, wherein
the contact electrically connected to the shielded electrode is disposed in a line between the penetrating electrodes.

6. The solid-state imaging element according to claim 1, wherein
the dielectric layer is disposed on a circumference of the penetrating electrodes.

7. The solid-state imaging element according to claim 1, wherein
the penetrating electrodes each penetrate the semiconductor substrate and are each isolated from the semiconductor substrate by an isolation trench, and
the dielectric layer and the isolation trench are in contact with each other.

8. The solid-state imaging element according to claim 1, further comprising:
one of a plurality of photodiodes disposed in the semiconductor substrate.

9. An electronic device, comprising:
a solid-state imaging element that includes:
a photoelectric conversion element disposed on a side of a first face of a semiconductor substrate;
penetrating electrodes that are each connected to the photoelectric conversion element, the penetrating electrodes each being disposed between the first face of the semiconductor substrate and a second face thereof that is a face different from the first face;
a transistor and a floating diffusion that are disposed in the second face, the transistor and the floating diffusion being connected to the photoelectric conversion element through the penetrating electrodes;
a dielectric layer that is formed between the penetrating electrodes in the second face, the dielectric layer being thicker than a gate insulating film of the transistor; and
a shielded electrode on an inner side of the dielectric layer seen from a side of the second face;
a signal processing circuit that processes an output signal output from the solid-state imaging element; and
an optical system that emits incident light into the solid-state imaging element.

10. The electronic device according to claim 9, wherein
a material of the shielded electrode includes polysilicon or amorphous silicon.

11. The electronic device according to claim 9, wherein
the shielded electrode is controlled to be at a predetermined voltage from a contact electrically connected to the shielded electrode and wiring electrically connected to the contact.

12. The electronic device according to claim 11, wherein
the contact electrically connected to the shielded electrode is disposed between the penetrating electrodes.

13. The electronic device according to claim 12, wherein
the contact electrically connected to the shielded electrode is disposed in a line between the penetrating electrodes.

14. The electronic device according to claim 9, wherein
the dielectric layer is disposed on a circumference of the penetrating electrodes.

15. The electronic device according to claim 9, wherein
the penetrating electrodes each penetrate the semiconductor substrate and are each isolated from the semiconductor substrate by an isolation trench, and
the dielectric layer and the isolation trench are in contact with each other.

16. The electronic device according to claim 9, further comprising:
one of a plurality of photodiodes disposed in the semiconductor substrate.

17. A fabrication method by a fabricating apparatus, the method comprising:
forming through-holes between a first face of a semiconductor substrate and a second face thereof that is a face different from the first face;
forming a dielectric layer between the through-holes in the second face, the dielectric layer being thicker than a gate insulating film of a transistor formed in the second face;
forming, in the second face, gate wiring that includes the transistor;
forming penetrating electrodes each by burying a metal material film in each of the through-holes;
forming, in the first face, the photoelectric conversion element that is connected to the transistor and a floating diffusion formed in the second face through the penetrating electrodes; and
forming a shielded electrode on an inner side of the dielectric layer seen from a side of the second face.

* * * * *